(12) United States Patent
Kawahara et al.

(10) Patent No.: US 7,037,812 B2
(45) Date of Patent: May 2, 2006

(54) MANUFACTURING METHOD OF CIRCUIT SUBSTRATE, CIRCUIT SUBSTRATE AND MANUFACTURING DEVICE OF CIRCUIT SUBSTRATE

(75) Inventors: Yuusuke Kawahara, Tokyo (JP); Tetsuya Yoshida, Tokyo (JP); Kazuhiro Murata, Ibaraki (JP); Hiroshi Yokoyama, Ibaraki (JP)

(73) Assignees: Konica Minolta Holdings, Inc., Tokyo (JP); National Institute of Advanced Industrial Science and Technology, Tokyo (JP)

( * ) Notice: Subject to any disclaimer, the term of this patent is extended or adjusted under 35 U.S.C. 154(b) by 72 days.

(21) Appl. No.: 10/668,777

(22) Filed: Sep. 22, 2003

(65) Prior Publication Data

US 2004/0059455 A1    Mar. 25, 2004

(30) Foreign Application Priority Data

Sep. 24, 2002   (JP)   ............................. 2002-278223
Aug. 8, 2003    (JP)   ............................. 2003-290162

(51) Int. Cl.
*H01L 21/20* (2006.01)

(52) U.S. Cl. ...................... 438/500; 438/478; 438/584; 438/674

(58) Field of Classification Search ................ 438/500, 438/478, 674, 660, 608, 584
See application file for complete search history.

(56) References Cited

U.S. PATENT DOCUMENTS

| 6,503,831 B1 * | 1/2003 | Speakman ................... 438/674 |
| 2002/0050061 A1 * | 5/2002 | Komyoji et al. .............. 29/846 |

FOREIGN PATENT DOCUMENTS

| JP | 09-320363 | * 12/1997 |
| JP | 11-274671 | * 10/1999 |

\* cited by examiner

*Primary Examiner*—Michael Trinh
(74) *Attorney, Agent, or Firm*—Cohen, Pontani, Lieberman & Pavane

(57) ABSTRACT

A manufacturing method of a circuit substrate, in which an electronic circuit is formed on a surface of a base member by a solution jetting device. The manufacturing method comprises: jetting liquid drops of a solution which is supplied into a nozzle having a discharge port with an inner diameter of 0.1 μm to 100 μm and includes a plurality of fine particles to form an electronic circuit by melting and sticking to one another and a dispersant for dispersing the fine particles, from the discharge port toward the surface of the base member by applying a voltage of an arbitrary waveform to the solution to charge the solution; and exposing the jetted liquid drops received on the surface of the base member to light or heat to make the fine particles melt and stick to one another.

10 Claims, 15 Drawing Sheets

101b(101B)　　101A　　101b(101B)

101b(101B)　　101A　　101b(101B)

MANUFACTURING METHOD OF CIRCUIT SUBSTRATE, CIRCUIT SUBSTRATE AND MANUFACTURING DEVICE OF CIRCUIT SUBSTRATE

BACKGROUND OF THE INVENTION

1. Field of the Invention

The present invention relates to a manufacturing method of a circuit substrate to form an electronic circuit on a surface of a base member, a circuit substrate manufactured by the method and a manufacturing device of the circuit substrate.

2. Description of Related Art

Recently, a technique for forming an electronic circuit on a surface of a base member by jetting an ink including conductive fine particles, for example, through a thermal type of or a piezo type of solution jetting device, has been developed. The technique is, for example, disclosed in Patent Document 1 (Unexamined Japanese Patent Publication No. Tokukaihei-9-320363 (1997)) and Patent Document 2 (Unexamined Japanese Patent Publication No. Tokukai-2002-134878). Further, a technique for forming an electronic circuit including condensers and resistors on a surface of a base member by selectively jetting an ink including conductive or insulating fine particles through a piezo type of solution jetting device has been developed (Unexamined Japanese Patent Publication No. 11-274671 (1999)).

According to these techniques, a circuit substrate having an electronic circuit with a line width of tens μm can be made.

In various electronic products such as a portable phone, a video camera and the like which are desired to be miniaturized and have high performance, the circuit substrate is desired to be further miniaturized and have a further high performance. Therefore, the formation of the electronic circuit having a further fine line width is desired.

However, there are following problems in the earlier developments or prior arts, and the problems prevent formation of fine line width in the electronic circuit.

(1) Stability Problem of Formation of a Fine Liquid Drop:

Because the diameter of a nozzle is large, the shape of a liquid drop jetted from the nozzle is not stable.

(2) Insufficient Accuracy in the Position of the Jetted Fine Liquid Drop to be Received on the Circuit Substrate:

The kinetic energy given to a liquid drop jetted from a nozzle is proportional to the third power of a liquid drop diameter. Therefore, a fine liquid drop has no sufficient kinetic energy to resist the air disturbance, so that the fine liquid drop flying toward the circuit substrate is disturbed by the air convection. As a result, it is difficult that the fine liquid drop accurately arrives at an aimed position of the circuit substrate. Further, as the liquid drop is finer, the effect of the surface tension of the liquid drop is increased, the vapor pressure of the liquid drop is heightened, and an amount of vaporized liquid is increased. Therefore, the weight of the fine liquid drop is considerably decreased during the flying of the drop, and it is difficult that the fine liquid drop merely maintains a drop shape. Therefore, the high positional accuracy of the arriving fine liquid drop on the circuit substrate contradicts the formation of the finer liquid drop, and it is difficult to obtain the fine liquid drop correctly arriving at a predetermined position.

Further, an electrostatic suction type of solution jetting device is used to jet liquid drops on the surface of the substrate and is disclosed in both Patent Document 4 (Unexamined Japanese Patent Publication No. Tokukaihei-8-238774 (1996)) and Patent Document 5 (Unexamined Japanese Patent Publication No. Tokukai-2000-127410).

However, the solution jetting devices of the documents have the same problems as those described above, and there are following additional problems.

(3) Applied High Voltage

In the electrostatic suction type of solution jetting devices, charge is concentrated in the center of an end portion (hereinafter, may be referred to a meniscus area) of a solution held in a nozzle to swell the meniscus area. The swelled meniscus area is formed in a hemispherical shape. A curvature radius of a tailor cone end of the swelled meniscus area is determined according to the amount of concentrated charge, and an electrostatic force is induced in the meniscus area according to the electric field strength generated by the concentrated charge. When the electrostatic force is larger than the force caused by the surface tension of the solution, a liquid drop is separated from the solution of the meniscus area.

A maximum amount of concentrated charge in the meniscus area is determined by physical properties (particularly, surface tension) and a meniscus curvature radius of the solution. Therefore, a size of the minimum liquid drop is determined by the physical properties such as surface tension of the solution and the electric field strength induced in the meniscus area.

The surface tension of a solvent including a solute is generally inclined to be lower than that of a pure solvent. Because an actual solution comprises a solvent and various solutes, it is difficult to heighten the surface tension of the actual solution. Accordingly, it has been thought that the surface tension of the solution is constant, a method for minifying the size of the liquid drop by increasing the electric field strength has been adopted in the earlier development.

Therefore, in the solution jetting devices of the documents, a highly-strengthened electric field is formed in the meniscus area considerably wider than the projective area of a liquid drop to concentrate charges at the center of the meniscus area, so that the liquid drop is jetted by the electrostatic force which is induced by the concentrated charges and the formed electric field. In this case, it is required to apply a very high voltage of around 2000V to the solution. Therefore, a problem that the driving control of the devices is difficult and the solution jetting devices may not be safely operated, has arisen.

(4) Response of Jet

In the solution jetting devices, because a highly-strengthened electric field is formed in the meniscus area considerably wider than the projective area of a liquid drop to concentrate charges at the center of the meniscus area, so that the liquid drop is jetted by the electrostatic force which is induced by the concentrated charges and the formed electric field, there has been a problem that the charge moving time required for moving the charges to the center of the meniscus area exerts effect on the response performance of the jet of the liquid drop and on formation speed of a liquid drop pattern.

SUMMARY OF THE INVENTION

In order to solve the above problem, an object of the present invention is to provide a manufacturing method of a circuit substrate which has an electronic circuit with a line width smaller than tens μm, formed thereon reliably, by jetting fine liquid drops. Another object of the present invention is to provide a circuit substrate manufactured by the manufacturing method. A further object of the present invention is to provide a manufacturing device for manufacturing the circuit substrate.

In order to accomplish the above-described object, in accordance with the first aspect of the present invention, the manufacturing method of a circuit substrate, in which an electronic circuit is formed on a surface of a base member by a solution jetting device, comprises:

jetting liquid drops of a solution which is supplied into a nozzle having a discharge port with an inner diameter of 0.1 μm to 100 μm and includes a plurality of fine particles to form an electronic circuit by melting and sticking to one another and a dispersant for dispersing the fine particles, from the discharge port toward the surface of the base member by applying a voltage of an arbitrary waveform to the solution to charge the solution; and exposing the jetted liquid drops received on the surface of the base member to light or heat to make the fine particles melt and stick to one another.

In the above-described construction, the nozzle has a ultra small diameter which was not obtained in the earlier development. Accordingly, the electric field is concentrated at the top of the nozzle to heighten the electric field strength. The effect of the nozzle having a very small diameter will be described later in detail. When the electric field strength is heightened, a liquid drop can be jetted without a counter electrode facing the top of the nozzle. For example, without a counter electrode, when a base member is arranged to face the top of the nozzle, in a case that the base member is a conductor, a mirror image charge having polarity inverse to that of the top of the nozzle is induced at a position symmetric to that of the top of the nozzle with respect to a receiving surface of the substrate, and in a case that the base member is an insulator, a projected image charge having polarity inverse to that of the top of the nozzle is induced at a symmetric position which depends on the dielectric constant of the base member with respect to the receiving surface of the substrate. The liquid drop flies by an electrostatic force between the charge induced to the top of the nozzle and the mirror image charge or between the charge induced to the top of the nozzle and the projected image charge.

In the construction of the present invention, no counter electrode is required. However, a counter electrode may be used. When a counter electrode is used, the electrostatic force caused by the electric field between the nozzle and the counter electrode is also useful for introducing the flying charge of the liquid drop. When the counter electrode is grounded, charge of the electrified liquid drop can be released to the ground through the counter electrode, and the accumulation of charge can be suppressed. Therefore, such a combined use of the counter electrode is preferable.

According to the first aspect of the invention, because the inner diameter of the nozzle is set to 0.1 μm to 100 μm, therefore, the distribution of the electric field strength is narrowed, and the electric field can be concentrated by applying a voltage of an arbitrary wave form to the solution supplied into the nozzle. As a result, a fine liquid drop can be formed, and the shape of the liquid drop can be stabilized. Accordingly, a liquid drop pattern composed of a plurality of liquid drops each of which has a volume smaller than that in the earlier development, for example, 1 pico-liter or 100 femto-liter, can be formed on the surface of the base member. Further, because the distribution of the electric field strength is narrowed, a total voltage applied to the solution in the nozzle can be reduced.

Further, the liquid drop is accelerated just after being jetted from the nozzle by the electrostatic force induced between the electric field and the electric charge. When the liquid drop is moved to be away from the nozzle, the electric field strength is rapidly lowered. Therefore, the liquid drop is decelerated by air resistance afterward. However, as the fine liquid drop with a concentrated electric field approaches the base member, the liquid drop is accelerated by the image mirror force. When the deceleration due to the air resistance is balanced with the acceleration due to the image mirror force, the liquid drop can stably fly, and the position accuracy of the jetted liquid drop received onto the surface of the base member can be improved.

Thereafter, the fine liquid drop received on the surface of the base member is heated up or radiated by light. As a result, the dispersant of the liquid drop is broken down and vaporized, and the fine particles of the liquid drop contact with one another, melt and stick to one another. Accordingly, an electronic circuit with a fine line width smaller than 10 μm can be formed on the surface of the base member. In other words, a circuit substrate having an electronic circuit with a fine line width smaller than tens μm can be formed on the surface of the base member.

The electronic circuit is a circuit in which electrons are moved, and therefore the electronic circuit may include only wires or an electronic element. The inner diameter of the discharge port of the nozzle may be in a range of 0.1 μm to 10 μm. The fine particles may be dissolved in a liquid phase area of the solution.

Preferably, the average diameter of the fine particles is lower than or equal to 100 nm.

According to the manufacturing method, because the average diameter of the fine particles is lower than or equal to 100 nm, the fine particles can be easily jetted from the discharge port with an inner diameter in a range of 0.1 μm to 100 μm. Further, an electronic circuit having fine line width can be formed by melting and sticking the fine particles to one another.

Preferably, the average diameter of the fine particles is lower than or equal to 50 nm.

Preferably, the fine particles are made of a conductive material.

According to the manufacturing method, because the fine particles are made of the conductive material, a wire, a conductive film or an electrode film can be formed on the surface of the base member when the fine particles melt and stick to one another.

Preferably, the fine particles are made of a semi-conductive material.

According to such a manufacturing method, because the fine particles are made of the semi-conductive material, a resistive film can be formed on the surface of the base member when the fine particles melt and stick to one another. Therefore, a resistor can be formed on the surface of the base member by forming wires on both ends of the resistive film.

Preferably, the fine particles are made of an insulating material or a dielectric material.

According to such a method, because the fine particles are made of the insulating material or the dielectric material, an insulating film can be formed on the surface of the base member when the fine particles melt and stick to one another. Therefore, for example, a condenser can be formed on the surface of the base member by forming electrode films so as to place the insulating film between the electrode films.

Preferably, the inner diameter of the discharge port is smaller than or equal to 30 µm.

According to such a manufacturing method, because the inner diameter of the discharge port is smaller than or equal to 30 µm, the distribution of the electric field strength is narrowed. Thereby, the electric field can be further concentrated. As a result, a further finer liquid drop can be formed, the shape of the liquid drop can be stabilized, and a total voltage applied to the nozzle can be reduced. Further, the liquid drop is accelerated just after the discharge from the nozzle by the electrostatic force induced between the electric field and the charge. Moreover, when the liquid drop is moved to be away from the nozzle, the electric field strength is rapidly lowered. Therefore, the liquid drop is decelerated by an air resistance afterward. However, as the fine liquid drop having the concentrated electric field approaches a counter electrode, the liquid drop is accelerated by the image mirror force. When the deceleration due to the air resistance is balanced with the acceleration due to the image mirror force, the liquid drop can stably fly, and the positional accuracy of the arriving liquid drop can be improved.

Preferably, the inner diameter of the discharge port is smaller than 20 µm.

According to such a manufacturing method, because the inner diameter of the discharge port is smaller than 20 µm, the electric field can be further concentrated, a further fine liquid drop can be formed, and the influence on the distribution of the electric field strength by a change of the distance to the counter electrode during the liquid drop flying can be reduced. Accordingly, the influence of the positional precision of the counter electrode and characteristics and thickness of the base member on the shape of the liquid drop and the positional precision of the liquid drop arriving at the base member can be reduced.

Preferably, the inner diameter of the discharge port is smaller than or equal to 8 µm.

According to such a manufacturing method, because the inner diameter of the discharge port is smaller than 8 µm, the electric field can be still further concentrated, a still further fine liquid drop can be formed, and the influence on the distribution of the electric field strength by a change of the distance to the counter electrode during the liquid drop flying can be reduced. Accordingly, the influence of the positional precision of the counter electrode and characteristics and thickness of the base member on the shape of the liquid drop and the positional precision of the liquid drop arriving at the base member can be further reduced.

Preferably, the inner diameter of the discharge port is smaller than or equal to 4 µm.

According to such a manufacturing method, because the inner diameter of the discharge port is smaller than 4 µm, the electric field can be considerably concentrated, the maximum electric field strength can be heightened, a very fine liquid drop can be formed while stabilizing the shape of the liquid drop, and the jetting speed of the liquid drop at the start of the jet can be heightened. Therefore, the stability of the flying of the liquid drop can be improved. Accordingly, the positional precision of the liquid drop arriving at the base member can be improved, and the response performance in the jet can be improved.

Further, the nozzle having the inner diameter larger than 0.2 μm is desirable. When the inner diameter of the nozzle is set to be larger than 0.2 μm, the electrifying efficiency of the liquid drop can be improved. Accordingly, the stability in the jet of the liquid drop can be improved.

In accordance with the second aspect of the present invention, a manufacturing method of a circuit substrate, in which an electronic circuit is formed on a surface of a base member by a solution jetting device, comprises:

jetting liquid drops of a solution which is supplied into a nozzle having a discharge port with an inner diameter of 0.1 μm to 100 μm and includes a plurality of adhesion particles for adhering fine particles to form an electronic circuit by melting and sticking the fine particles to one another and a dispersant for dispersing the adhesion particles, from the discharge port toward the surface of the base member by applying a voltage of an arbitrary waveform to the solution to charge the solution; and scattering the fine particles on the jetted liquid drops received on the surface of the base member to adhere the fine particles to the adhesion particles;

removing fine particles which are not adhering to the adhesion particles among the scattered fine particles, from the surface of the base member; and exposing the surface of the base member to light or heat to make the fine particles melt and stick to one another.

According to the manufacturing method of the second aspect of the present invention, because the inner diameter of the nozzle is set to 0.1 μm to 100 μm, the distribution of the electric field strength is narrowed, and the electric field can be concentrated by applying a voltage of an arbitrary wave form to the solution supplied to the nozzle. As a result, a fine liquid drop can be formed, and the shape of the liquid drop can be stabilized. Accordingly, a liquid drop pattern composed of a plurality of liquid drops respectively set to a volume smaller than that in the earlier development, for example, 1 pico-liter or 100 femto-liter can form on the surface of the base member. Further, because the distribution of the electric field strength is narrowed, a total voltage applied to the solution of the nozzle can be lowered.

Further, the liquid drop is accelerated just after the jet from the nozzle by the electrostatic force induced between the electric field and the charge. Moreover, when the liquid drop is moved to be away from the nozzle, the electric field strength is rapidly lowered. Therefore, the liquid drop is decelerated by an air resistance afterward. However, as the fine liquid drop having the concentrated electric field approaches the base member, the liquid drop is accelerated by the image mirror force. When the deceleration due to the air resistance is balanced with the acceleration due to the image mirror force, the liquid drop can stably fly, and the positional accuracy of the arriving liquid drop can be improved.

The fine particles are scattered on the liquid drop arriving at the surface of the base member, the fine particles adhere to the adhesion particles. Thereafter, fine particles not adhering to the adhesion particles among the scattered fine particles are removed from the surface of the base member. Therefore, a fine particle pattern having the same shape as that of a liquid drop fine pattern formed on the surface of the base member can be formed on the liquid drop pattern.

Thereafter, the surface of the base member is heated up or radiated by light. Therefore, the dispersant of the liquid drop is broken down and vaporized, and the fine particles of the liquid drop contact with one another, melt and stick to one another. Accordingly, an electronic circuit having fine line width smaller than 10 μm can be formed on the surface of the base member. In other words, a circuit substrate having an electronic circuit with fine line width smaller than tens μm on the surface of the base member can be formed.

In accordance with the third aspect of the present invention, the circuit substrate is manufactured according to the manufacturing method of the first or second aspect of the invention.

According to the third aspect of the present invention, a circuit substrate having an electronic circuit with fine line width smaller than 10 μm can be formed.

In accordance with the fourth aspect of the present invention, the manufacturing device of a circuit substrate, in which an electronic circuit is formed on a surface of a base member by a solution jetting device, comprises:

a voltage applying section for jetting liquid drops of a solution which is supplied into a nozzle having a discharge port with an inner diameter of 0.1 μm to 100 μm and includes a plurality of fine particles to form an electronic circuit by melting and sticking to one another and a dispersant for dispersing the fine particles, from the discharge port toward the surface of the base member by applying a voltage of an arbitrary waveform to the solution to charge the solution; and a melting-sticking section for giving light or heat to the jetted liquid drops received on the surface of the base member to make the fine particles melt and stick to one another.

According to the manufacturing device of a circuit substrate of the fourth aspect of the present invention, the inner diameter of the nozzle is set to 0.1 μm to 100 μm. Therefore, the distribution of the electric field strength is narrowed, and the electric field can be concentrated by applying the voltage of an arbitrary wave form to the solution supplied to the nozzle. As a result, a fine liquid drop can be formed, and the shape of the liquid drop can be stabilized. Accordingly, a liquid drop pattern composed of a plurality of liquid drops, each of which is set to a volume smaller than that in the earlier development, for example, 1 pico-liter or 100 femto-liter, can form on the surface of the base member. Further, because the distribution of the electric field strength is narrowed, a voltage applied to the solution of the nozzle can be lowered.

The liquid drop is accelerated just after the jet from the nozzle by the electrostatic force induced between the electric field and the charge. Further, when the liquid drop is moved to be away from the nozzle, the electric field strength is rapidly lowered, and the liquid drop is decelerated by an air resistance afterward. However, when the fine liquid drop having the concentrated electric field approaches the base member, the liquid drop is accelerated by the image mirror force. When the deceleration due to the air resistance is balanced with the acceleration due to the image mirror force, the liquid drop can stably fly, and the positional accuracy of the arriving liquid drop can be improved.

The manufacturing device has the melting-sticking section for giving light or heat to the liquid drop arriving at the surface of the base member to make the fine particles melt and stick to one another. Therefore, when the fine particles of the liquid drop pattern formed on the surface of the base member melt and stick to one another, an electronic circuit having fine line width smaller than 10 μm can be formed on the surface of the base member. In other words, a circuit substrate having an electronic circuit with fine line width smaller than tens μm on the surface of the base member can be formed.

Preferably, the inner diameter of the discharge port is smaller than or equal to 30 μm.

According to the manufacturing device having such a structure, because the inner diameter of the discharge port is smaller than or equal to 30 μm, the distribution of the electric field strength is narrowed. Thereby, the electric field can be further concentrated. As a result, a further finer liquid drop can be formed, the shape of the liquid drop can be stabilized, and a total voltage applied to the solution for jetting the solution can be reduced. Further, the liquid drop is accelerated just after the jet from the nozzle by the electrostatic force induced between the electric field and the charge. Moreover, when the liquid drop is moved to be away from the nozzle, the electric field strength is rapidly lowered. Therefore, the liquid drop is decelerated by an air resistance afterward. However, as the fine liquid drop having the concentrated electric field approaches a counter electrode, the liquid drop is accelerated by the image mirror force. When the deceleration due to the air resistance is balanced with the acceleration due to the image mirror force, the liquid drop can stably fly, and the positional accuracy of the arriving liquid drop can be improved.

Preferably, the inner diameter of the discharge port is smaller than 20 μm.

According to the manufacturing device having such a structure, because the inner diameter of the discharge port is smaller than 20 μm, the electric field can be further concentrated, a further fine liquid drop can be formed, and the influence on the distribution of the electric field strength by a change of the distance to the counter electrode during the liquid drop flying can be reduced. Accordingly, the influence of the positional precision of the counter electrode and characteristics and thickness of the base member on the shape of the liquid drop and the positional precision of the liquid drop arriving at the base member can be reduced.

Preferably, the inner diameter of the discharge port is smaller than or equal to 8 μm.

According to the manufacturing device having such a structure, because the inner diameter of the discharge port is smaller than 8 μm, the electric field can be still further concentrated, a still further fine liquid drop can be formed, and the influence on the distribution of the electric field strength by a change of the distance to the counter electrode during the liquid drop flying can be reduced. Accordingly, the influence of the positional precision of the counter electrode and characteristics and thickness of the base member on the shape of the liquid drop and the positional precision of the liquid drop arriving at the base member can be further reduced.

Preferably, the inner diameter of the discharge port is smaller than or equal to 4 μm.

According to the manufacturing device having such a structure, because the inner diameter of the discharge port is smaller than 4 μm, the electric field can be considerably concentrated, the maximum electric field strength can be heightened, a very fine liquid drop can be formed while stabilizing the shape of the liquid drop, and the jetting speed of the liquid drop at the start of the jet can be heightened. Therefore, the stability of the flying of the liquid drop can be improved. Accordingly, the positional precision of the liquid drop arriving at the base member can be improved, and the response performance in the jet can be improved.

Further, the nozzle having the inner diameter larger than 0.2 μm is desirable. When the inner diameter of the nozzle is set to be larger than 0.2 μm, the electrifying efficiency of the liquid drop can be improved. Accordingly, the stability in the jet of the liquid drop can be improved.

In the present invention, the inner diameter of the nozzle is set to be smaller than 100 μm. Therefore, the distribution of the electric field strength is narrowed, and the electric field can be concentrated. As a result, a fine liquid drop can be formed, and the shape of the liquid drop can be stabilized. Further, a total voltage applied to the solution of the nozzle can be lowered. The liquid drop is accelerated just after the jet from the nozzle by the electrostatic force induced between the electric field and the charge. When the liquid drop is moved to be away from the nozzle, the electric field strength is rapidly lowered, and the liquid drop is decelerated by an air resistance afterward. However, as the fine liquid drop having the concentrated electric field approaches the counter electrodes, the liquid drop is accelerated by the image mirror force. When the deceleration due to the air resistance is balanced with the acceleration due to the image mirror force, the liquid drop can stably fly, and the positional accuracy of the arriving liquid drop can be improved.

Preferably, the inner diameter of the discharge port is smaller than or equal to 8 µm. When the inner diameter of the discharge port is set to be smaller than 8 µm, the electric field can be further concentrated. Therefore, a further finer liquid drop can be obtained. Further, because the influence on the distribution of the electric field strength by a change of the distance to the counter electrode during the liquid drop flying can be reduced, the influence of the positional accuracy of the counter electrode and properties and thickness of the base member on the shape of the liquid drop and the positional accuracy of the arriving liquid drop can be reduced.

When the inner diameter of the discharge port is set to be smaller than 4 µm, the electric field can be considerably concentrated, and a maximum electric field strength can be heightened. Therefore, an ultra fine liquid drop can be obtained while stabilizing the shape of the liquid drop, and the jetting speed of the liquid drop at the start of the jet can be heightened. Accordingly, because the stability in the fly of the liquid drop is improved, the positional accuracy of the arriving liquid drop can be further improved, and the response performance in the jet of the liquid drop can be improved.

Desirably, the inner diameter of the discharge port is equal to or larger than 0.2 µm. When the inner diameter of the discharge port is set to be equal to or larger than 0.2 µm, the electrifying efficiency of the liquid drop can be improved. Therefore, the stability in the jet of the liquid drop can be improved.

Preferably, each of the inventions described above is configured according to each of following items.

(1) The nozzle is made of an electrically insulating material, and an electrode is inserted into the nozzle or an electrode is formed in the nozzle by plating.

(2) According to the configuration of each invention described above or the configuration of the case (1), the nozzle is made of an electrically insulating material, an electrode is arranged on the outside of the nozzle in addition to the insertion of another electrode into the nozzle or the plating formation of another electrode in the nozzle.

In the cases (1) and (2), in addition to the function and effect in the configuration of each invention described above, the jet power can improved. Therefore, even though the diameter of the nozzle becomes further small, the liquid can be jetted at a low voltage.

(3) According to the configuration of each invention described above or the configuration of the case (1) or (2), the base member is made of a conductive material or an insulating material.

(4) According to the configuration of each invention described above or the configuration of the case (1), (2) or (3), the voltage V applied to the nozzle is set in a zone expressed according to the first formula.

$$h\sqrt{\frac{\gamma\pi}{\varepsilon_0 d}} > V > \sqrt{\frac{\gamma k d}{2\varepsilon_0}} \qquad (1)$$

Here, $\gamma$ denotes the surface tension (N/m) of the liquid, $\varepsilon_0$ denotes a dielectric constant (F/m) in vacuum, h denotes a length (m) between the nozzle and the base member, and k denotes a proportional constant (1.5<k<8.5) depending on nozzle shape.

(5) According to the configuration of each invention described above or the configuration of the case (1), (2), (3) or (4), the applied voltage of the arbitrary wave form is lower than or equal to 1000V.

(6) According to the configuration of each invention described above or the configuration of the case (1), (2), (3), (4) or (5), the applied voltage of the arbitrary wave form is lower than or equal to 500V. Further, the base member is mounted on a conductive or insulating base member holder.

(7) According to the configuration of each invention described above or the configuration of one of the cases (1) to (6), the length between the nozzle and the base member is smaller than or equal to 500 µm. In this case, even though the diameter of the nozzle is very small, the liquid drop can arrive at an aimed position with high accuracy.

(8) According to the configuration of each invention described above or in the configuration of one of the cases (1) to (7), the method is configured so as to pressurize the solution within the nozzle.

(9) According to the configuration of each invention described above or in the configuration of one of the cases (1) to (8), when the solution is jetted according to a single pulse, the method may be configured so as to apply a pulse having a pulse width $\Delta t$ equal to or longer than a time constant $\tau$ determined in the second formula to the nozzle.

$$\tau = \frac{\varepsilon}{\sigma} \qquad (2)$$

Here, $\varepsilon$ denotes a dielectric constant (F/m) of the liquid, and $\sigma$ denotes a conductivity (S/m) of the liquid.

BRIEF DESCRIPTION OF THE DRAWINGS

The present invention will become more fully understood from the detailed description given hereinbelow and the accompanying drawing which are given by way of illustration only, and thus are not intended as a definition of the limits of the present invention, and wherein;

FIG. 4 is an explanatory view showing the relationship between the solution jetting operation and the voltage applied to the solution.

FIG. 5 is a view showing the procedure of forming a liquid drop pattern of an insulating film on a surface of a base member.

FIG. 6 is a view showing the procedure of forming a liquid drop pattern of a conductive film on the surface of the base member.

FIG. 7 is a view showing the procedure of forming a liquid drop pattern of another conductive film on the surface of the base member.

FIG. 8 is a view conceptually showing the dry processing and the melting-sticking processing.

FIG. 9 is a view showing the procedure of forming a liquid drop pattern of an resisting film on the surface of the base member.

FIG. 10 is a view showing the procedure of forming a liquid drop pattern of a conductive film on the surface of the base member.

FIG. 11 is a view showing the procedure of forming a liquid drop pattern of another conductive film on the surface of the base member.

PREFERRED EMBODIMENTS OF THE INVENTION

Embodiment

Hereinafter, an embodiment of a manufacturing device of a circuit substrate according to the present invention will be explained with reference to the drawings.

The inner diameter (hereinafter, named nozzle diameter) of a discharge port of a nozzle of a liquid jetting device described in the embodiment is preferably smaller than or equal to 30 µm. More preferably, the nozzle diameter is smaller than or equal to 20 µm. Further more preferably, the nozzle diameter is smaller than or equal to 8 µm. Still further more preferably, the nozzle diameter is smaller than or equal to 4 µm. The nozzle diameter is preferably larger than or equal to 0.2 µm.

(Manufacturing Device of Electronic Circuit)

(Total Configuration of Manufacturing Device of Electronic Circuit)

Figure 1:
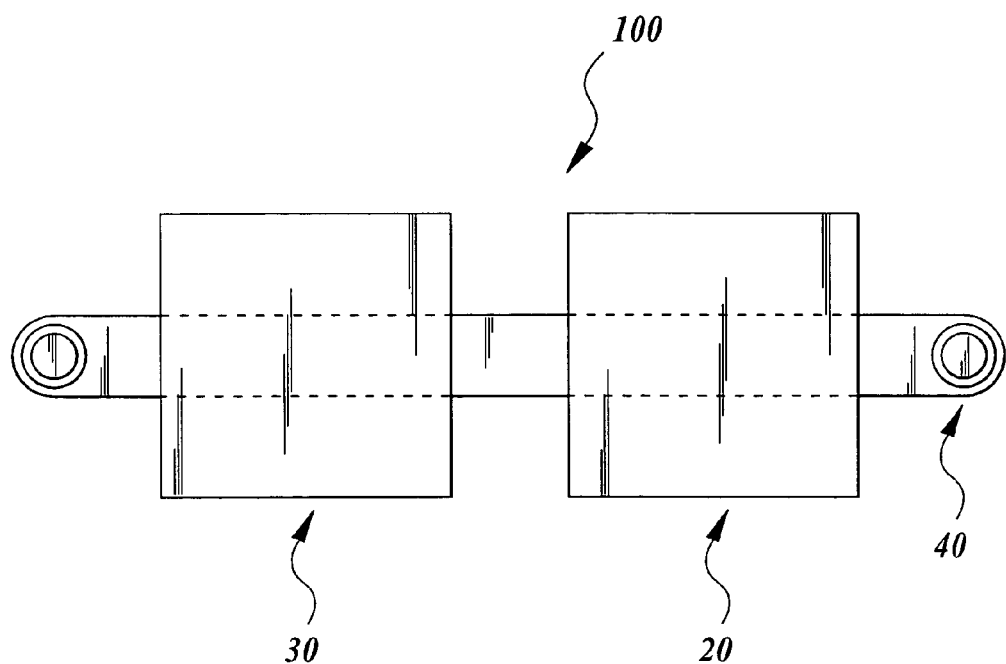
FIG. 1 is a plan view schematically showing the configuration of a manufacturing device of an electronic circuit according to an embodiment of the present invention.

FIG. 1 is a plan view schematically showing the configuration of a device (hereinafter, named manufacturing device) 100 for manufacturing an electronic circuit. The manufacturing device 100 comprises a solution jetting device 20 for jetting liquid drops of a solution on a surface of a base member K, a melting-sticking device (melting-sticking section) 30 for making fine particles included in a liquid drop pattern of the liquid drops melt and stick to one another, and a carrying device 40 for carrying the base member K to the devices 20 and 30.

A solution jetted by the solution jetting device 20 includes a plurality of fine particles or a plurality of adhesion particles having an adhesive property and a dispersant dispersing the fine particles or the adhesion particles in a solvent of the solution. The dissolved fine particles melt and stick to one another to form the electronic circuit.

Particles of metal or a metal compound can be used as the fine particles. The particles of metal are made of conductive fine particles of Au, Pt, Ag, In, Cu, Ni, Cr, Rh, Pd, Zn, Co, Mo, Ru, W, Os, Ir, Fe, Mn, Ge, Sn, Ga, or the like. Particularly, when the fine particles of metal such as Au, Ag or Cu are used, an electronic circuit having low electric resistance and high corrosion-resistance can be preferably made. As the fine particles of a metal compound, there are conductive fine particles of ZnS, CdS, $Cd_2SnO_4$, ITO ($In_2O_3$—$SnO_2$), $RuO_2$, $IrO_2$, $OsO_2$, $MoO_2$, $ReO_2$, $WO_2$, $YBa_2Cu_3O_7$-x, or the like, fine particles of ZnO, CdO, $SnO_2$, $InO_2$, $SnO_4$, or the like having conductivity after thermal reduction, semi-conductive fine particles of Ni—Cr, Cr—SiO, Cr—MgF, Au—$SiO_2$, AuMgF, $PtTa_2O_5$, $AuTa_2O_5Ta_2$, $Cr_3Si$, $TaSi_2$, or the like, dielectric fine particles of $SrTiO_3$, $BaTiO_3$, $Pb(Zr, Ti)O_3$, or the like, and insulating fine particles of $SiO_2$, $Al_2O_3$, $TiO_2$, or the like.

The adhesion particles are made of particles of thermosetting resin adhesive, gum adhesive, emulsion adhesive, poly-aromatics, ceramics adhesive or the like.

The dispersant acts as protective colloid for the fine particles. A block copolymer of polyurethane and alkanol-amine, polyester or polyacrylo-nitrile is used as the dispersant.

The solvent is selected by considering affinity for the fine particles. For example, the solvent mainly including water or the solvent mainly including PGMEA, cyclohexane, (butyl) carbinol-acetate, 3-dimethyl-2-imidazole-lysine, BMA or propylene-mono-methyl-acetate is used.

Now a method of processing an aqueous solution having dissolved metallic fine particles as the fine particles is, for example, described.

A water soluble polymer is initially dissolved in a source solution of metallic ions such as ions of gold chloride or silver nitrate, and alkanol-amine such as dimethyl-aminoethanol is added to the solution while agitating the solution. After tens seconds to several minutes, metallic ions are reduced in the solution, and metallic fine particles having an average particle diameter of 100 nm or less are precipitated. After chlorine ions or nitric ions are removed from the solution including precipitated particles according to the ultrafilteration method, the solution is concentrated and dried. The aqueous solution obtained by the above-described process can be stably dissolved in and mixed with water, alcohol solvent or binder for sol-gel process such as tetra-ethoxy-silane or triethoxy-silane.

A method of processing an oily solution having dissolved metallic fine particles as the fine particles is described.

An oil soluble polymer is initially dissolved in a water-miscibility organic solvent such as acetone, and the solution is mixed with the aqueous solution formed described above. In this case, the obtained mixture is heterogeneous. When alkanol-amine is added to the mixture while agitating the mixture, metallic fine particles are precipitated in an oil phase in the form of dispersing in the polymer. Thereafter, when the solution is washed, concentrated and dried, an oily solution is obtained. The oily solution obtained as described above can be stably dissolved in a solvent of aromatic, ketone or ester, or can be stably or mixed with polyester, epoxy resin, acrylic resin or polyurethane resin.

The concentration of the metallic fine particles in the aqueous or oily solution can be set to a maximum of 80% by weight. The solution is adequately diluted according to a use condition and is used. Normally, it is appropriate that the content of the metallic fine particles in the solution ranges from 2 to 50% by weight, the content of the dispersant in the solution ranges from 0.3 to 30% by weight, and the viscosity of the solution ranges from 3 to 100 centipoises.

The base member K is a base on which the electronic circuit is formed. An arbitrary material adequate to the use condition can be used as the base member K on condition that the material can resist the drying processing or the melting-sticking processing of the melting-sticking device 30 described later. For example, the material such as glass, ceramic, acrylic, polyimide film, polyamide-imide film, polyester film, polyamide film, glass-epoxy or paper-phenol can be used as the base member K. Particularly, the base member K of glass, ceramic, polyimide film, polyamide-imide film, glass-epoxy, paper-phenol preferably, or the like has superior heat resistance and superior electrical insulation.

(Solution Jetting Device)
(Total Configuration of Solution Jetting Device)

Figure 2:
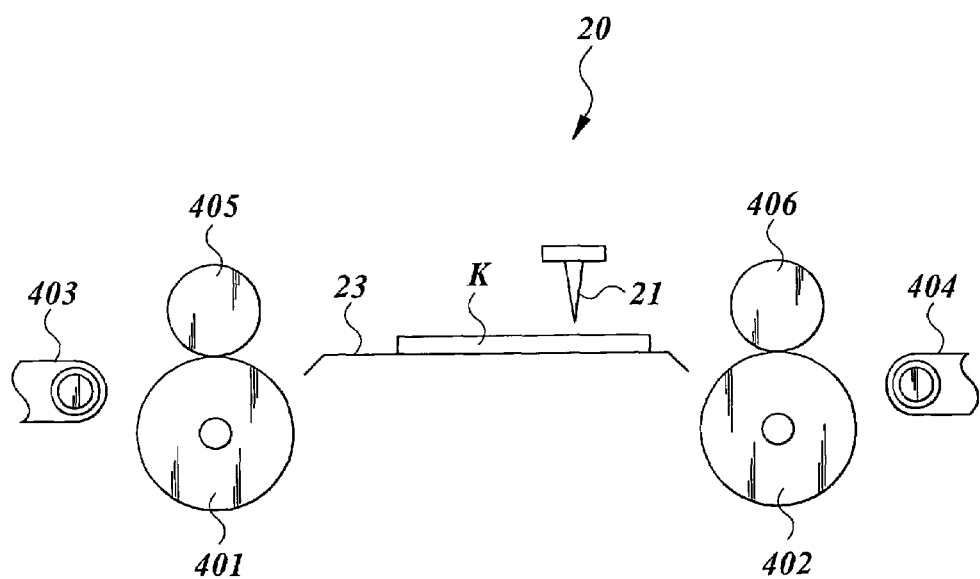
FIG. 2 is a side view schematically showing the configuration of a solution jetting device according to the embodiment of the present invention.
Figure 3:
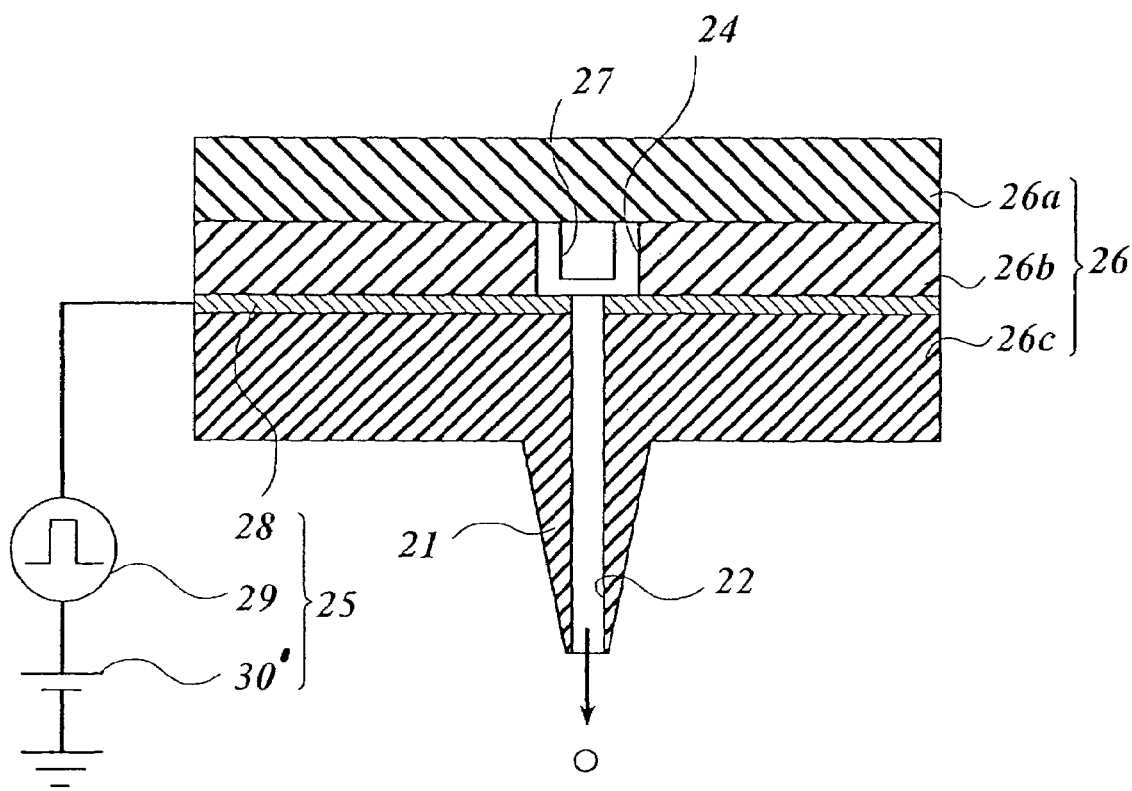
FIG. 3 is a vertical sectional view taken substantially along a line cutting a nozzle of the solution jetting device of FIG. 2.
Figure 3:
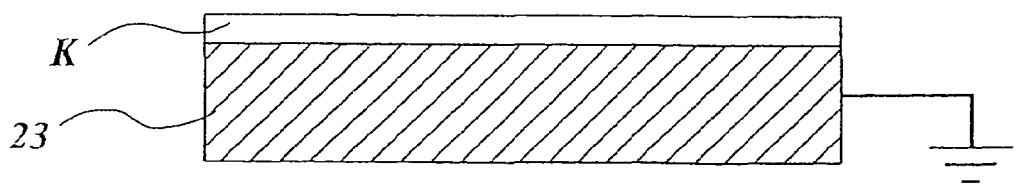
Figure 4A:
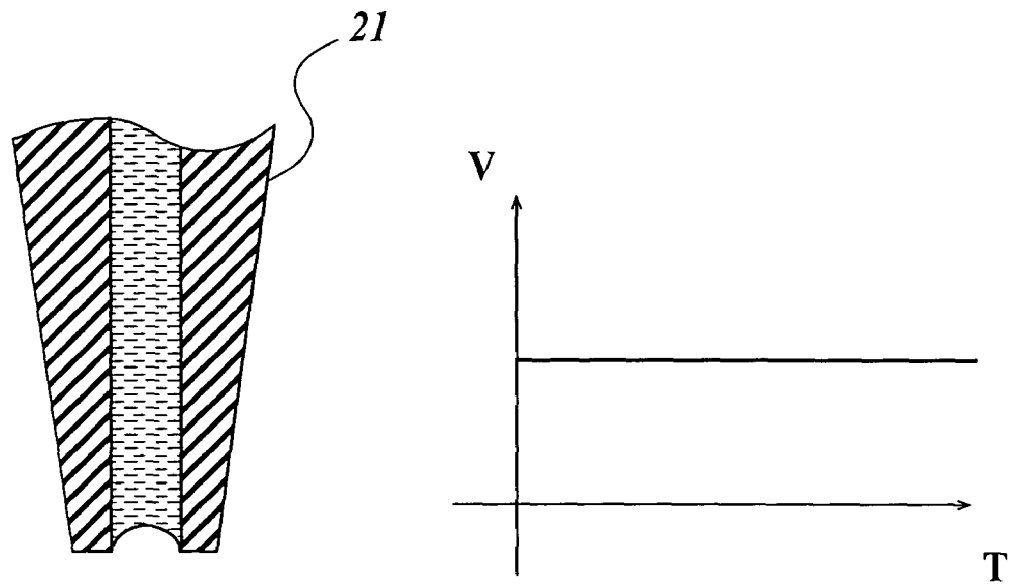
FIG. 4A shows a non-jetting state.
Figure 4B:
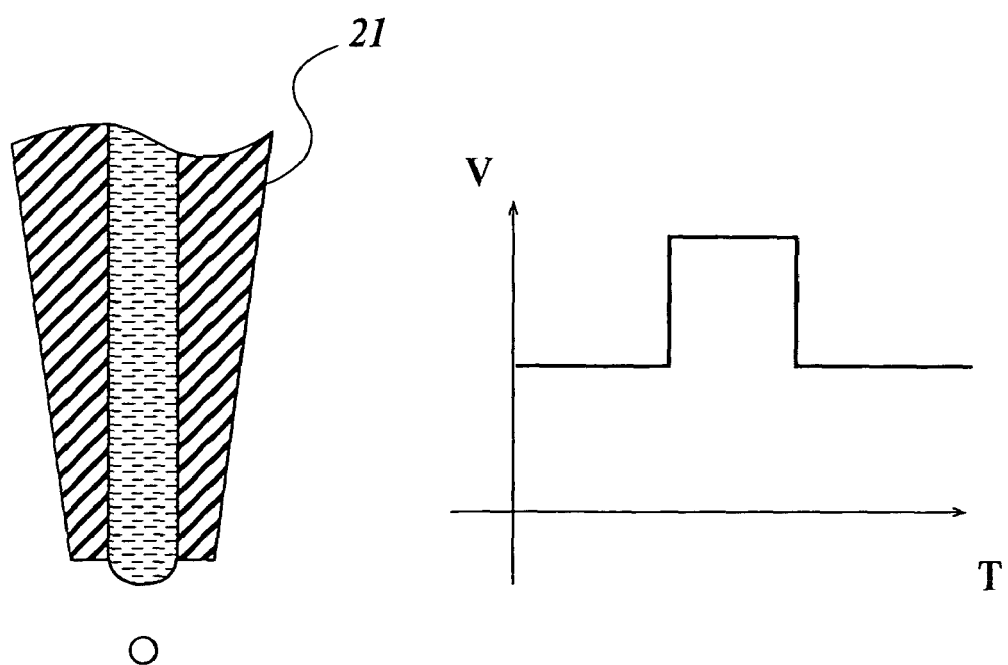
FIG. 4B shows a jetting state.

FIGS. 2 to 4 show the solution jetting device 20 shown in FIG. 1 in detail. FIG. 2 is a side view schematically showing the configuration of the solution jetting device 20. FIG. 3 is a vertical sectional view of the solution jetting device 20 taken substantially along a nozzle 21 described later. FIG. 4 is an explanatory view showing the relationship between the solution jetting operation and the voltage applied to the solution. FIG. 4A shows a non-jetting state. FIG. 4B shows a jetting state.

The solution jetting device 20 comprises a nozzle 21, having a very small diameter, for jetting a liquid drop of electrification possible solution from a top portion of the nozzle 21 toward the base member K, a counter electrode 23 having an opposite surface which is opposite to the top portion of the nozzle 21 and supporting the base member K on the opposite surface, a solution supply section for supplying the solution to a nozzle inner channel 22 of the nozzle 21, and a jetting voltage applying section (voltage applying section) 25 for applying a jetting voltage of an arbitrary wave shape to the solution of the nozzle 21. The nozzle 21, a part of the solution supply section and a part of the jet voltage applying section 25 are integrally formed with a nozzle plate 26.

(Nozzle 21)

The nozzle 21 is arranged so as to extend from a lower surface layer 26c of the nozzle plate 26 described later in the vertical direction and is integrally formed with the lower surface layer 26c. The top portion of the nozzle 21 is directed to the counter electrode 23. In the inside of the nozzle 21, the channel 22 penetrating the nozzle 21 from the top portion along a center line thereof is formed.

The nozzle 21 will be described in more detail. The nozzle 21 is made of an electrical insulator such as glass and is formed in very small diameter. As an example of the size of parts of the nozzle 21, the inner diameter of the nozzle inner channel 22 is 1 μm, the outer diameter of the top portion of the nozzle 21 is 2 μm, the diameter of the upper end portion of the nozzle 21 denoting the root of the nozzle 21 is 5 μm, and the height of the nozzle 21 is set to 100 μm. The nozzle 21 is formed in a conical trapezoidal shape extremely similar to a conical shape. The whole nozzle 21 are integrally formed with the lower surface layer 26c of the nozzle plate 26 and is made of the insulating resin material.

The size of the parts of the nozzle 21 is not limited to the example described above. Particularly, in the range of the jet voltage lower than 1000V at which the jet of the liquid drop according to the effect of the concentration of the electric field can be performed, the inner diameter of the discharge port is, for example, equal to or smaller than 100 μm, is hopefully equal to or smaller than 20 μm, and is, for example, a lower limit of 0.1 μm at which an opening can be formed according to the current nozzle forming technique so as to pass the liquid through.

(Solution Supply Section)

The solution supply section comprises a solution chamber 24 arranged at the position of the root of the nozzle 21 in the inside of the nozzle plate 26 and lead to the nozzle inner channel 22, a supply channel 27 leading the solution from an external solution tank (not shown) to the solution chamber 24, and a supply pump (not shown) for providing a supply pressure of the solution applied to the solution chamber 24.

The above-described supply pump supplies the solution to the top portion of the nozzle 21 while maintaining the supply pressure not to spill the solution from the top portion (refer to FIG. 4A).

(Jetting Voltage Applying Section)

The jet voltage applying section 25 jets a liquid drop of the electrified solution from the discharge port of the nozzle 21 toward the base member K by applying the jet voltage to the solution of the nozzle 21. The jet voltage applying section 25 comprises a jet electrode 28 which is arranged at the boundary position between the solution chamber 24 and the nozzle inner channel 22 in the inside of the nozzle plate 26, for receiving the jet voltage, a bias power source 30' for always applying a bias voltage of a direct current to the jet electrode 28, and a jet voltage source 29 for applying a pulse voltage which is superposed on the bias voltage to be an electric potential required for the jet to the jet electrode 28. The jet electrode 28 directly contacts with the solution in the inside of the solution chamber 24 to electrify the solution and apply the jet voltage to the solution.

The bias voltage not sufficient to jet the solution is always applied to the solution by the bias power source 30'. Therefore, the pulse voltage to be applied for the jet can be lowered in advance, and the response performance in the jet can be improved by the bias voltage.

When the solution is jetted, the jet voltage source 29 applies the pulse voltage which is superposed on the bias voltage to the jet electrode 28. The pulse voltage is set on condition that the superposed jet voltage V satisfies the condition of the third equation.

$$h\sqrt{\frac{\gamma\pi}{\varepsilon_0 d}} > V > \sqrt{\frac{\gamma k d}{2\varepsilon_0}} \qquad (3)$$

Here, $\gamma$ denotes the surface tension (N/m) of the solution, $\varepsilon_0$ denotes the dielectric constant (F/m) in vacuum, d denotes the nozzle diameter (m), h denotes the length (m) between the nozzle and the base member, and k denotes a proportional constant (1.5<k<8.5) depending on the shape of the nozzle 21.

As an example, the bias voltage is set to DC300V, and the pulse voltage is set to 100V. Therefore, the superposed jet voltage set to 400V is applied to the jet electrode 28 for the jet.

(Nozzle Plate)

The nozzle plate 26 comprises an upper surface layer 26a which is placed at the uppermost position in FIG. 3, a channel layer 26b which is placed under the upper surface layer 26a for forming a supply path of the solution, and the lower surface layer 26c which is placed under the channel layer 26b. The jet electrode 28 is placed between the channel layer 26b and the lower surface layer 26c. The nozzle plate 26 set in an upside down condition to that shown in FIG. 3 is formed. In detail, the upper surface layer 26a is made of a silicon plate, high insulating resin or ceramic. A dissolvable resin layer is formed on the upper surface layer 26a and is removed while remaining portions of the dissolvable resin layer agreeing with the pattern of the supply path 27 and the solution chamber 24, and an insulating resin layer is formed in an area in which the dissolvable resin layer is removed. This insulating resin layer will be processed to form the channel layer 26b according to the laser processing described later. Thereafter, the jet electrode 28 is formed on an upper surface of the insulating resin layer by the plating technique using conductive material (for example, NiP), and an insulating resist resin layer is formed on the jet electrode 28. This insulating resist resin layer will be processed to form the lower surface layer 26c according to the laser processing described later. Therefore, the thickness of the resist resin layer is set while considering the height of the nozzle 21. Thereafter, the insulating resist resin layer is exposed according to an electron beam method or by a femto-second laser, and the insulating resist resin layer is formed in a nozzle shape. The nozzle inner path 22 is formed according to the laser processing. Thereafter, the dissolvable resin layer agreeing with the pattern of the supply path 27 and the solution chamber 24 is removed, and the supply path 27 and the solution chamber 24 are opened. Therefore, the fabrication of the nozzle plate 26 is completed.

(Counter Electrode)

The counter electrode 23 has an opposite surface perpendicular to the nozzle 21 and supports the base member K along the opposite surface. The length from the top portion of the nozzle 21 to the opposite surface of the counter electrode 23 is maintained to a constant value, for example, 100 μm.

Because the counter electrode 23 is grounded, the counter electrode 23 is always set to the ground potential. Therefore, when the pulse voltage is applied, the liquid drop jetted by the electrostatic force of the electric field induced between the top portion of the nozzle 21 and the opposite surface is forcedly lead to the counter electrode 23.

Because the solution jetting device 20 jets the liquid drop by heightening the electric field by the concentration of the electric field at the top portion of the nozzle 21 due to the very small diameter of the nozzle 21, the liquid drop can be jetted without the forced leading to the counter electrode 23. However, the forced leading due to the electrostatic force between the nozzle 21 and the counter electrode 23 is preferably performed. In this case, the liquid drop jetted from the nozzle 21 and decelerated due to the air resistance can be accelerated due to image force. Therefore, when the deceleration due to the air resistance is balanced with the acceleration due to the image force, a minute liquid drop can stably fly, and the positional accuracy of the arriving liquid drop can be improved. Further, the charge of the electrified liquid drop can be released due to the grounded counter electrode 23.

A scan type solution jetting device freely performing the scanning in a direction perpendicular to a carrier direction (left direction in FIG. 1) of the base member K by using a driving mechanism (not shown) may be used as the solution jetting device 20 described above. In this case, a plurality of nozzles 21 may be arranged in the solution jetting device 20.

Further, a line type solution jetting device having a large number of nozzles 21 arranged along the direction perpendicular to the carrier direction of the base member K may be used as the solution jetting device 20.

(Melting-Sticking Device 30)

(General Configuration of Melting-Sticking Device 30)

The melting-sticking device 30 radiates light to or heats the liquid drops arriving at the surface of the base member K to break down and vaporize the dispersant of the liquid drops, and melts and sticks the fine particles to one another.

The melting-sticking device (hereinafter, named a thermal melting-sticking device) 30 heating the liquid drops comprises a chamber (not shown) for receiving the base member K having the arriving liquid drops and keeping temperature to a constant value, a temperature control unit (not shown) for controlling the temperature, and a fun (not shown) for circulating air in the inside of the chamber. The temperature control unit of the thermal melting-sticking device heats the chamber to maintain the temperature at which the base member K is not softened, the fine particle is not oxidized, and the dispersant of the liquid drops is broken down and vaporized. In this temperature environment, the fine particles contact with one another in each liquid drop due to the breaking down and vaporization of the dispersant and melt and stick to one another as a result. Therefore, the inside of the chamber is not necessarily required to be maintained to a temperature higher than the melting point of the fine particles, and the inside of the chamber may be maintained to a temperature lower than the melting point of the fine particles. This temperature value depends on the materials of the base member K and the dispersant. For example, when a base material such as glass, ceramic, acrylic, polyimide film or the like having heat resistance equal to or lower than 300° C. is used as the base member K, the temperature of the inside of the chamber preferably ranges from 120° C. to 250° C.

When the fine particles having conductivity due to the reduction based on the heat melt and stick to one another, the thermal melting-sticking device is used as the melting-sticking device 30. In this case, a heat control unit of the thermal melting-sticking device heats up the inside of the chamber and maintain the temperature at which the base member K is not softened, the fine particles are reduced, and the dispersant of the liquid drop is broken down and vaporized. This temperature depends on the materials of the base member K and the dispersant.

The melting-sticking device (hereinafter, named an optical melting-sticking device) 30 radiating light to the liquid drops comprises a chamber (not shown) for receiving the base member K having the arriving liquid drops and keeping temperature to a constant value, a temperature control unit (not shown) for controlling the temperature, a fun (not shown) for circulating air in the inside of the chamber, and a radiating section (not shown) for radiating light such as ultraviolet rays to the base member K having the arriving liquid drops by using a laser or a lamp. In this optical melting-sticking device 30, the dispersant of the liquid drop is broken down and vaporized by the light which is radiated from the radiating section. The radiating section is arranged in the inside of the chamber in this embodiment. However, the radiating section may be arranged in the outside of the chamber. The temperature control unit of the optical melting-sticking device 30 dries the liquid drop while maintaining the temperature in the inside of the chamber, at which the base member K is not softened, the fine particle is not oxidized, and the solvent of the liquid drop is vaporized. As an example, the temperature is maintained to 100° C. or 150° C.

(Carrying Device)

(General Configuration of Carrying Device)

As shown in FIG. 2, the carrying device comprises carrying rollers 401 and 402 and belt conveyers 403 and 404 for carrying the base member K, and pressurizing rollers 405 and 406 which are arranged above the carrying rollers 401 and 402 for holding and sandwiching the base member K between the carrying rollers 401 and 402.

The carrying rollers 401 and 402 are arranged so as to hold across the counter electrode 23 in the horizontal direction between the carrying rollers 401 and 402. The carrying roller 401 is arranged on the upper side in the carrying direction of the base member K, and the carrying roller 402 is arranged on the lower side in the carrying direction.

The belt conveyers 403 and 404 are arranged to hold the carrying rollers 401 and 402 in the horizontal direction between the belt conveyers 403 and 404. The belt conveyer 403 is arranged on the upstream side in the carrying direction of the base member K, and the belt conveyer 404 is arranged on the downstream side in the carrying direction.

Carrier machines (not shown) are arranged on the upstream and downstream sides in the carrying direction of the base member K to hold across the chamber of the welding-sticking device 30 between the carrier machines, and the carrier machines carry the base member K which is carried by the belt conveyer 404 to the inside of the chamber and carry the base member K of the chamber to the belt conveyer 404.

(Manufacturing Operation of Circuit Substrate in Manufacturing Device)

Next, an operation of the manufacturing device 100 will be described with reference to FIG. 2.

The belt conveyer 403 and the carrier roller 401 are rotationally driven to carry the base member K on the carrier roller 401. Thereafter, the carrier roller 401 carries the base member K on the counter electrode 23 while holding and sandwiching the base member K between the carrier roller 401 and the pressurizing roller 405.

Next, when the scan type of solution jetting device 20 is used, liquid drops are jetted to the base member K while scanning the solution jetting device 20 in the carrying direction of the base member K, and a desired liquid drop pattern is formed on the base member K. When the line type solution jetting device 20 is used, liquid drops are linearly jetted to the base member K, and a desired liquid drop pattern is formed on the base member K. The operation of the solution jetting device 20 will be described in detail in a following item (Jetting Operation of Fine Liquid Drops in Solution Jetting Device).

Next, the base member K having the liquid drop pattern on the counter electrode 23 is removed from the counter electrode 23 while holding and sandwiching the base member K between the carrier roller 402 and the pressurizing roller 406, and is carried into the chamber of the welding-sticking device 30 through the belt conveyer 404 and the carrying machine.

Next, the liquid drops placed on the surface of the base member K are dried by increasing the temperature in the inside of the chamber (hereinafter, this processing is named dry processing). Thereafter, the fine particles of the dried liquid drops melt and stick to one another (hereinafter, this processing is named welding-sticking processing). As a result, an electronic circuit is formed on the surface of the base member K.

Thereafter, the base member K is removed from the chamber by the carrier machines and the belt conveyer 404.

(Jetting Operation of Fine Liquid Drops in Solution Jetting Device)

Next, an operation of the solution jetting device 20 in the manufacturing device 100 will be described with reference to FIGS. 3 and 4.

A solution supplied by a supply pump of a solution supply section exists in the nozzle inner channel 22, and the bias voltage is applied to the solution by the bias power source 30 ' through the jet electrode 28. In this condition, the solution is electrified, and a meniscus portion of the solution which is formed in a concave shape is formed at the top of the nozzle 21 (FIG. 4A).

Thereafter, when the pulse voltage is applied to the solution by the jet voltage source 29, the solution is moved toward the top of the nozzle 21 due to the electrostatic force which depends on the electric field strength of the electric field concentrated at the top of the nozzle 21. Therefore, a meniscus portion of the solution formed in a convex shape and protruded to the outside is formed at the top of the nozzle 21, and the electric field is further concentrated on the vertex of the convex shaped meniscus portion. Finally, a fine liquid drop is jetted against the surface tension of the solution toward the counter electrode (FIG. 4B).

In the solution jetting device 20, because the liquid drop is jetted from the nozzle 21 having a very small diameter, the electric field is concentrated in the solution electrified in the nozzle inner channel 22, and the electric field strength is heightened. Therefore, the jet of the solution from the nozzle 21 can be performed at low voltage.

Because the inner diameter of the discharge port of the nozzle 21 is very small, the conductance of the nozzle 21 is low. Therefore, an amount of the jetted solution per unit time can be easily controlled to be lowered, and the solution set to a sufficiently small liquid drop diameter can be jetted without narrowing the pulse width of the pulse voltage.

Further, because the jetted liquid drop is electrified, the vapor pressure is lowered even if the liquid drop is very small, and the vaporization of the liquid drop is suppressed. Therefore, the loss of the quantity of the liquid drop can be reduced, and the frying of the liquid drop can be stabilized.

As a result, the lowering of the positional accuracy of the arriving liquid drop can be prevented.

To give an electro-wetting effect to the nozzle 21, an electrode is preferably arranged on the outer circumference of the nozzle 21, or an electrode is preferably arranged on the inner circumference of the nozzle 21 while being covered with an insulating film. When the voltage is applied to the electrode, because the voltage is applied to the solution by the jet electrode 28, the wetting performance of the solution to the inner surface of the nozzle inner channel 22 due to the electro-wetting effect can be heightened, and the supply of the solution to the nozzle inner channel 22 can be smoothly performed. Therefore, the solution can be preferably jetted, and the response performance in the jet can be improved.

In the jet voltage applying section 25, the bias voltage is always applied to the solution, and the liquid drop is jetted while using the pulse voltage as a trigger. However, the jet configuration may be set so as to always apply an alternating current or successive rectangular waves at an amplitude required for the jet and to change the frequency of the alternating current or the successive rectangular waves. To jet the liquid drop, the electrification of the solution is necessary. Further, even if the jet voltage is applied at a frequency higher than that corresponding to a time required for electrifying the solution, no liquid drop is jetted. When the frequency is changed to another frequency corresponding to the sufficient electrification of the solution, the liquid drop can be jetted. Therefore, when the jet is not required, the jet voltage is applied at a frequency higher than that corresponding to a time required for electrifying the solution. When the jet is required, the control is performed to lower the frequency to a frequency band at which the solution can be sufficiently electrified. In this case, because the electric potential applied to the solution is not changed, the response in time can be improved, and the positional accuracy of the arriving liquid drop can be improved.

Next, the procedure for forming an electronic circuit on the surface of the base member K by using the manufacturing device 100 will be described.

FIRST EXAMPLE

In a first example, an electronic circuit having wires of Ag is formed on the surface of the base member K by using the manufacturing device 100.

A solution supplied to the nozzle 21 of the solution jetting device 20 includes fine particles of Ag and a dispersant in a mixed solvent of propylene-glycol-monomethyl-acetate and isopropyl-alcohol. In more detail, in this solution, propylene-glycol-monomethyl-acetate is mixed with an isopropyl-alcohol dispersant solution in which the content of the fine particles of Ag is 20 wt % and the content of the dispersant is 5 wt % to make the content of the fine particles of Ag 15 wt %. An average particle diameter of the fine particles of Ag is 10 nm. The nozzle 21 of the solution jetting device 20 is made of glass, and the inner diameter of the discharge port is 2.0 μm. The thermal melting-sticking device is used as the melting-sticking device 30. The material of polyimide film is used as the base member K.

Hereinafter, the procedure will be described.

A liquid drop pattern is initially drawn on the surface of the base member K at the line width of 8 μm and the film thickness of 0.7 μm by the solution jetting device 20. In detail, when the scan type solution jetting device is used, liquid drops are jetted to the base member K while the solution jetting device 20 is scanned in the carrying direction of the base member K. When the line type solution jetting device is used, liquid drops are linearly jetted to the base member K. Therefore, a desired liquid drop pattern is formed on the base member K.

Thereafter, the drying processing is performed by maintaining the temperature in the inside of the chamber of the thermal melting-sticking device to 150° C. for ten minutes. Thereafter, the melting-sticking processing is performed by maintaining the temperature in the inside of the chamber to 200° C. for twenty minutes, and wires are formed on the surface of the base member K.

The resistance value of the obtained wires is equal to $1.6 \times 10^{-5}$ Ωcm, and it is ascertained that the wires can be used as an electronic circuit.

SECOND EXAMPLE

In a second example, an electronic circuit having wires of Cu is formed on the surface of the base member K by using the manufacturing device 100.

A solution supplied to the nozzle 21 of the solution jetting device 20 includes fine particles of Cu and a dispersant in a mixed solvent of water and propylene-glycol-monomethyl-acetate. In more detail, in this solution, propylene-glycol-monomethyl-acetate is mixed with a water dispersant solution including the fine particles of Cu and the dispersant so as to obtain the solution in which the content of the fine particles of Cu is 30 wt % and the content of the dispersant is 10 wt %. An average particle diameter of the fine particles of Cu is 40 nm. The nozzle 21 of the solution jetting device 20 is made of glass, and the inner diameter of the discharge port is 2.0 μm. The thermal melting-sticking device is used as the melting-sticking device 30. Glass is used as the base member K.

Hereinafter, the procedure will be described.

A liquid drop pattern is initially drawn on the surface of the base member K at the line width of 12 μm and the film thickness of 0.8 μm by the solution jetting device 20 in the same manner as in the first example. Thereafter, the drying processing is performed by maintaining the temperature in the inside of the chamber of the thermal melting-sticking device to 150° C. for ten minutes. Thereafter, the melting-sticking processing is performed by maintaining the temperature in the inside of the chamber to 200° C. for twenty minutes, and wires are formed on the surface of the base member K.

The resistance value of the obtained wires is equal to $3.0 \times 10^{-5}$ Ωcm, and it is ascertained that the wires can be used as an electronic circuit.

THIRD EXAMPLE

In a third example, an electronic circuit having a condenser is formed on the surface of the base member K by using the manufacturing device 100. In more detail, an insulating film 101A and conductive films 101B, that is, electrodes are formed on the surface of the base member K. The insulating film 101A is placed between the conductive films 101B.

In the third example, the scan type solution jetting device 20 is used.

When the insulating film 101A is formed, a solution (hereinafter, named an insulating solution) having a solvent of PGMEA, cyclohexane, carbinol-acetate or the like is supplied to the nozzle 21 of the solution jetting device 20. In this insulating solution, particles of the insulating material such as $SiO_2$, $Al_2O_3$ or particles of the dielectric material such as $SrTiO_3$, $BaTiO_3$ or $Pb(Zr, Ti)O_3$ are used as the fine particles. Further, glycerin, diethylene glycol, ethylene-glycol or the like is added to the solution as wetting agent or binder if necessary.

When the conductive films 101B are formed, a solution (hereinafter, named a conductive solution) having a solvent of butyl-carbinol-acetate, 3-dimethyl-2-imidazole-lysine, BMA or the like is supplied to the nozzle 21 of the solution jetting device 20. In this conductive solution, particles of the conductive material such as $RuO_2$, $IrO_2$, $OSO_2$, $MoO_2$, $ReO_2$, $WO_2$ or $YBa_2Cu_3O_7-x$, Pt, Au, Ag, In, In—Ga compound, Ga or solder are used as the fine particles.

Hereinafter, the procedure is described with reference to FIGS. 5A to 8B. FIGS. 5A, 6A, 7A and 8A show vertical sectional views taken along a center line of a condenser to be formed, and FIGS. 5B, 6B, 7B and 8B show plan views.

Figure 5A:
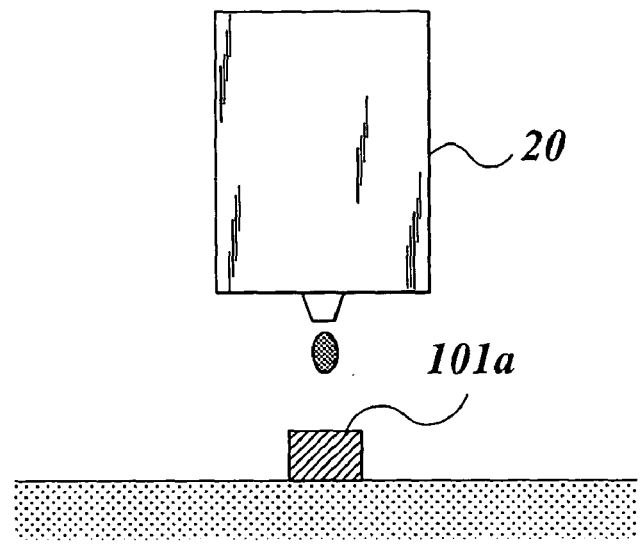
FIG. 5A is a vertical sectional view of a solution jetting device and the base member.
Figure 5B:
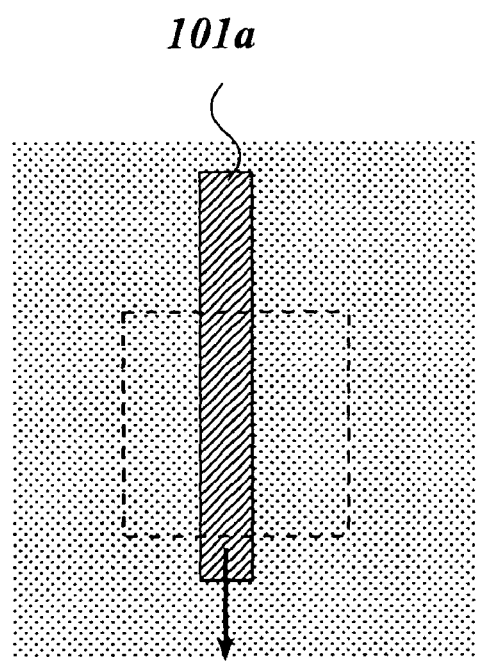
FIG. 5B is a plan view of the liquid drop pattern.

As shown in FIGS. 5A and 5B, the insulating film 101A is initially formed on the surface of the base member K.

In detail, as shown in FIG. 5A, the solution jetting device 20 is moved to and scanned in the area of the insulating film 101A to be formed, and liquid drops of the insulating solution are jetted from the nozzle 21 toward the surface of the base member K. In this case, the nozzle 21 is moved as shown by an arrow of FIG. 5B by scanning the solution jetting device 20 while jetting the liquid drops, and a rectangular liquid drop pattern (hereinafter, named an insulating liquid drop pattern) 101a is formed on the surface of the base member K. Because the capacitance of the condenser generally depends on the area of the counter electrode, distance between the counter electrodes and a dielectric constant, the width and length of the insulating liquid drop pattern 101a and the dielectric constant of the insulating material are set according to an aimed capacitance of the condenser.

Thereafter, the insulating film 101A is formed on the surface of the base member K by performing the drying processing and the melting-sticking processing in the inside of the chamber of the melting-sticking device 30. When the liquid drops include the fine particles of the insulating material, even though the insulating film 101A is not densely formed, because no electric influence is adversely received in the insulating film 101A, it is admitted that only the drying processing is performed. However, to tightly form the insulating film 101A, the melting-sticking processing is preferably performed.

In case of the formation of the thickened insulating film 101A, the dried insulating liquid drop patterns 101a are preferably formed in a plurality of layers to jet and dry liquid drops on the dried insulating liquid drop pattern 101a or to jet and dry liquid drops of the insulating solution including the fine particles of another material on the dried insulating liquid drop pattern 101a. When the fine particles of the insulating liquid drop patterns 101a in the layers melt and stick to one another, the condenser can have the function similar to that of a multi-layered structure. The reason why the liquid drops are jetted after the drying of the insulating liquid drop pattern 101a is as follows. Assuming that the liquid drops are jetted on a non-dried insulating liquid drop pattern 101a, the liquid drops flow out so as to undesirably widen the insulating liquid drop pattern 101a, and a desired electric characteristic cannot be obtained. Assuming that the liquid drops of the insulating solution including the fine particles of another material are jetted and dried on the non-dried insulating liquid drop pattern 101a, the insulating liquid drop pattern 101a is undesirably spread, and the liquid drops including the fine particles of different materials are mixed with each other. Therefore, a desired electric characteristic cannot be obtained.

When the distance between the conductive films 101B to be formed is small, the insulating material of the liquid drops jetted for the formation of the conductive film 101B is preferably selected so as to make the insulating film 101A formed on the top side have non-affinity performance for the conductive material. In this case, because the liquid drops jetted for the formation of the conductive film 101B are repelled by the insulating film 101A which is formed on the top side, the short circuit of the electrodes can be prevented.

Figure 6A:
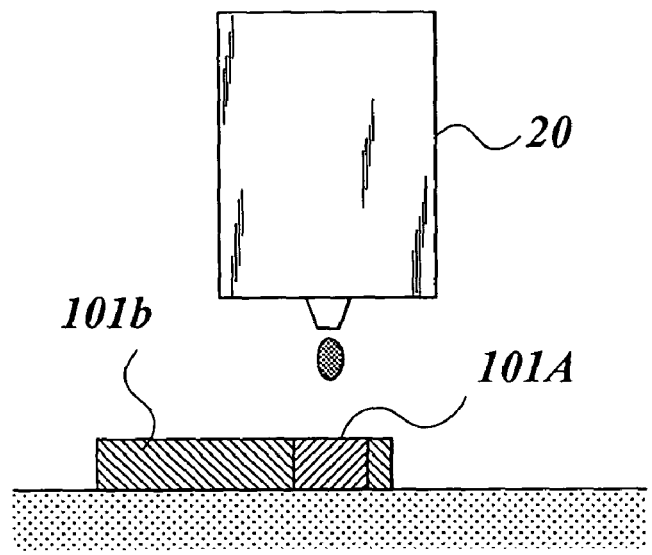
FIG. 6A is a vertical sectional view of the solution jetting device and the base member.
Figure 7A:
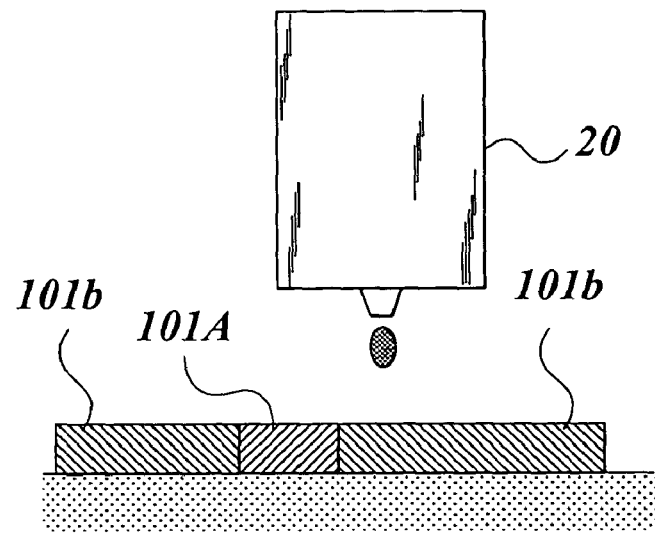
FIG. 7A is a vertical sectional view of the solution jetting device and the base member.

Thereafter, as shown in FIGS. 6A and 7A, the solution jetting device 20 is moved to and scanned in the areas of the conductive films 101B to be formed, and the conductive films 101B are formed so as to place the insulating film 101A between the conductive films 101B.

Figure 6B:
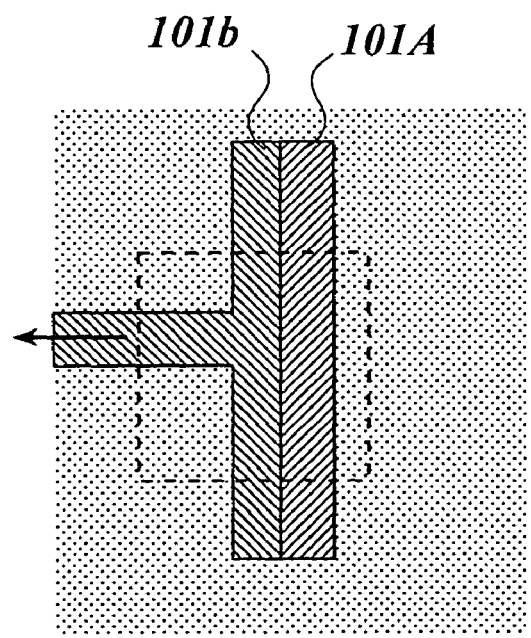
FIG. 6B is a plan view of the liquid drop pattern.
Figure 7B:
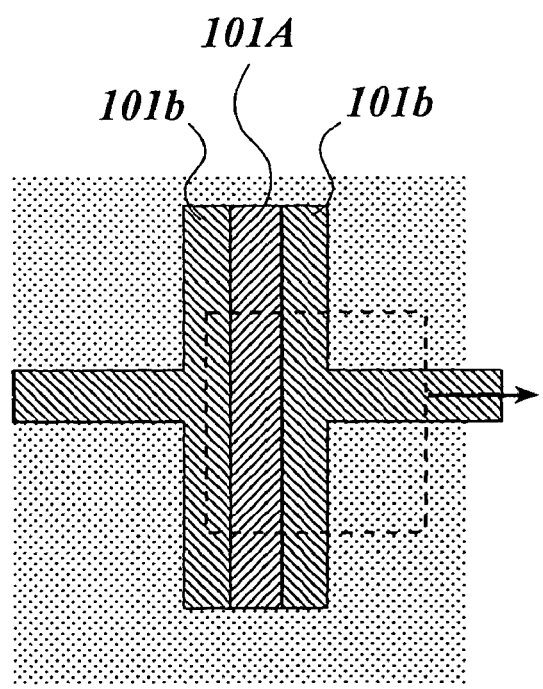
FIG. 7B is a plan view of the liquid drop pattern.
Figure 8A:
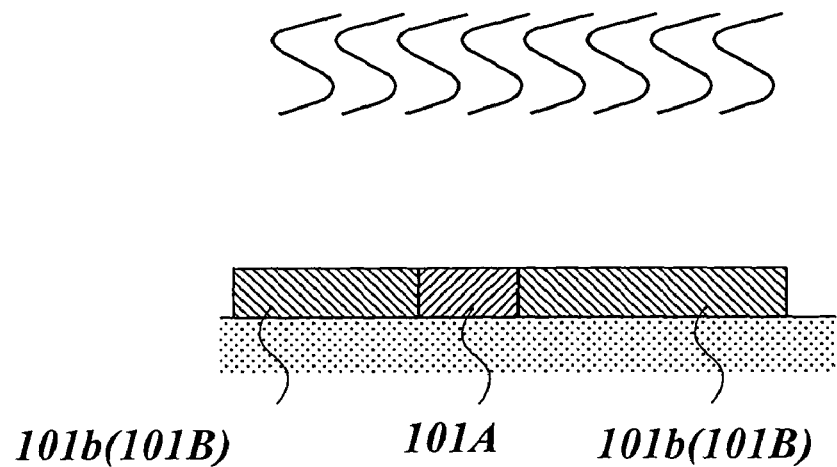
FIG. 8A is a vertical sectional view of a melting-sticking device and the base member.
Figure 8B:
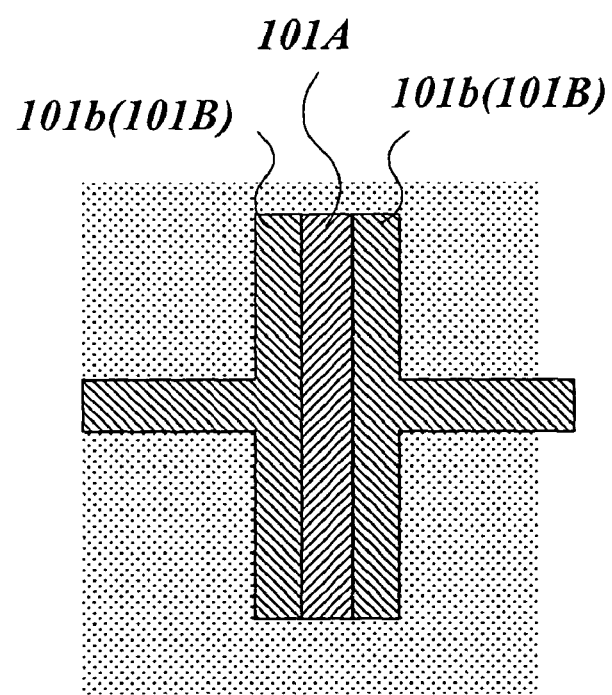
FIG. 8B is a plan view of a condenser on the base member.

In detail, the nozzle 21 is moved as shown by arrows of FIGS. 6B and 7B by scanning the solution jetting device 20 while jetting the liquid drops. Therefore, two liquid drop patterns (hereinafter, named conductive liquid drop patterns) 101b and 101b are formed on the surface of the base member K so as to place the insulating film 101A between the conductive liquid drop patterns 101b and 101b. Various shapes of the liquid drop pattern 101b other than the shape shown in FIGS. 5A to 7B can be allowed. For example, the conductive liquid drop pattern 101b and the insulating liquid drop pattern 101a are formed in a serrate shape or a concave-convex shape so as to make the conductive liquid drop patterns 101b engage with each other through the insulating film 101A. In this case, the capacitance of the condenser can be further increased. Further, to increase the capacitance of the condenser, the area of the electrode is preferably increased by heightening the insulating film 101A and the opposite surfaces of the conductive films 101B.

Thereafter, the conductive films 101B acting as the electrodes of the condenser are formed on the surface of the base member K by performing the drying processing and the melting-sticking processing in the inside of the chamber of the melting-sticking device 30.

The conductive films 101B may be formed as follows.

Liquid drops of a solution (hereinafter, named an adhesion solution) including a plurality of adhesion particles and a plurality of dispersion particles are jetted from the nozzle 21, and liquid drop patterns (hereinafter, named adhesion liquid drop patterns) are formed on the surface of the base member K.

Thereafter, fine particles made of a conductive material or a dielectric material are scattered on the upper surface of the base member K, and the fine particles adhere to the adhesion particles.

Thereafter, fine particles not adhere to the adhesion particles among the fine particles scattered on the upper surface of the base member K are blown off. Therefore, fine particle patterns having the same shape as that of the adhesion liquid drop patterns are formed and remain on the adhesion liquid drop pattern.

Thereafter, the conductive films 101B acting as the electrodes of the condenser are formed on the surface of the base member K by performing the drying processing and the melting-sticking processing in the inside of the chamber of the melting-sticking device 30.

When the sticking performance of the formed conductive films 101B to the base member K is low, a film (hereinafter, named an affinity film) having an affinity performance is preferably formed as a ground layer by using a solution (hereinafter, named an affinity solution) including a material of a high affinity performance for the adhesion solution. For example, when the solvent of the adhesion solution is an organic solvent, the affinity solution of a porous material such as paraffin, aluminum oxide or silica is jetted to form the affinity film. In this case, the adhesion solution has a high affinity performance for the affinity film. Therefore, when the adhesion solution is jetted on the affinity film, the adhesion solution is spread on the affinity film, and the conductive film 101B strongly sticking to the affinity film is formed. In contrast, when the sticking performance of the formed conductive films 101B to the base member K is excessively high and the adhesion solution is excessively spread on the surface of the base member K, it is preferred that a solution (hereinafter, named a non-affinity solution) including a material of a non-affinity performance for the adhesion solution is used, and a film (hereinafter, named a non-affinity film) having a non-affinity performance is formed out of the non-affinity solution so as to surround the areas of the conductive films 101B. For example, when the solvent of the adhesion solution shows a hydrophilic property, the affinity solution of a porous material such as paraffin, aluminum oxide or silica is jetted to form the non-affinity film. In this case, because the non-affinity film repels the adhesion solution, the adhesion solution does not spread out of the areas surrounded by the non-affinity film. The step of arranging the affinity film or the non-affinity film may be applied when the insulating film 101A or the like is formed.

When there is the shortage of the conductivity of the condenser formed, the conductive films 101B are preferably lengthened to widen the areas of the counter electrodes or the dielectric material is jetted on the insulating film 101A or prolonged portions of the conductive films 101B. In this case, the conductivity of the condenser can be minutely adjusted.

FORTH EXAMPLE

In a fourth example, an electronic circuit having a resistor is formed on the surface of the base member K by using the manufacturing device 100. In more detail, a resistant film 101C and conductive films 101B, that is, electrodes are formed on the surface of the base member K. The resistant film 101C is placed between the conductive films 101B.

In the fourth example, the scan type solution jetting device 20 is used.

When the resistant film 101C is formed, a solution (hereinafter, named a resistant solution) having a solvent of PGMEA, cyclohexane, carbinol-acetate or the like is supplied to the nozzle 21 of the solution jetting device 20. In this resistant solution, particles of the semi-conductive material such as Ni—Cr, Cr—SiO, Cr—MgF, Au—SiO$_2$, AuMgF, PtTa$_2$O$_5$, AuTa$_2$O$_5$Ta$_2$, Cr$_3$Si, TaSi$_2$ or the like or the mixture of particles of the conductive material and particles of the insulating material are used as the fine particles. Further, glycerin, diethylene glycol, ethylene glycol or the like is added to the solution as wetting agent or binder if necessary.

When the conductive films 101B are formed, the same conductive solution as that in the third example is used.

Figure 9A:
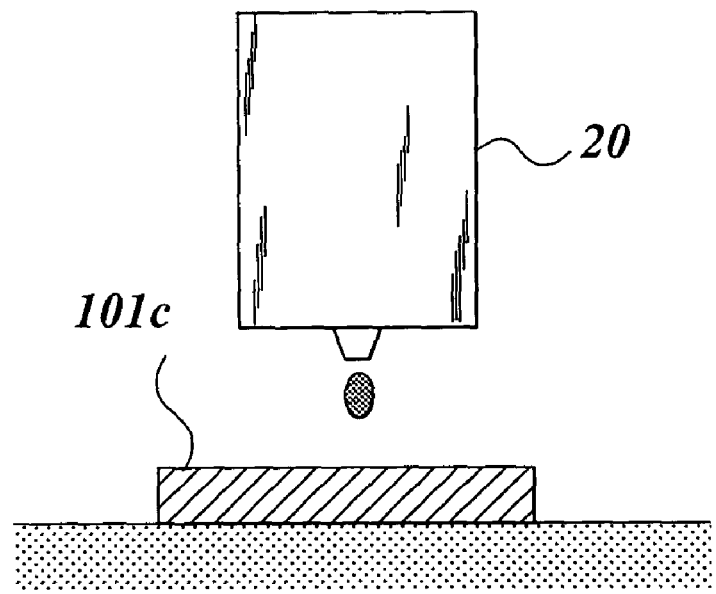
FIG. 9A is a vertical sectional view of the solution jetting device and the base member.
Figure 10A:
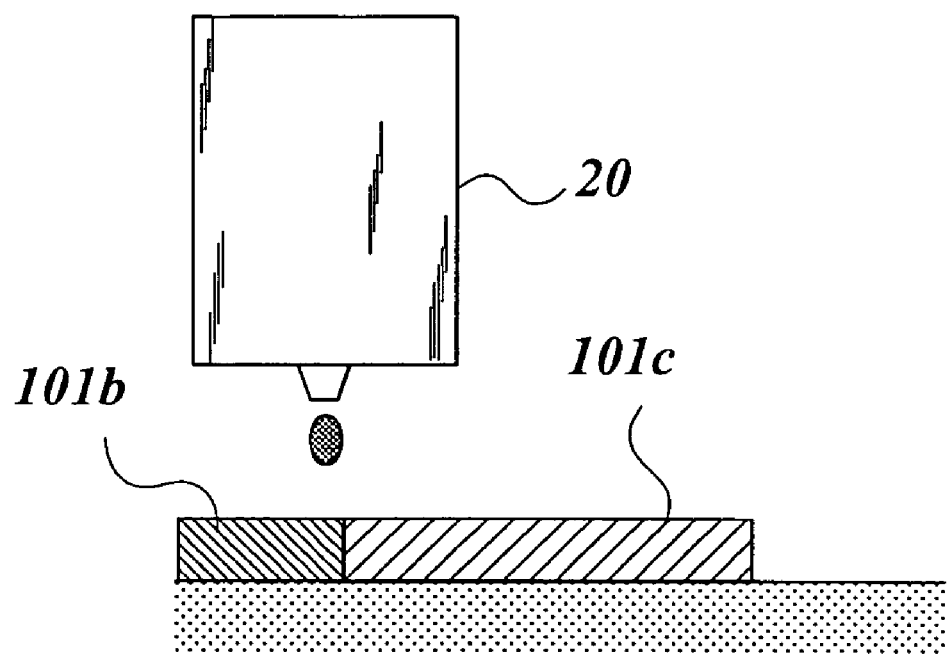
FIG. 10A is a vertical sectional view of the solution jetting device and the base member.
Figure 10B:
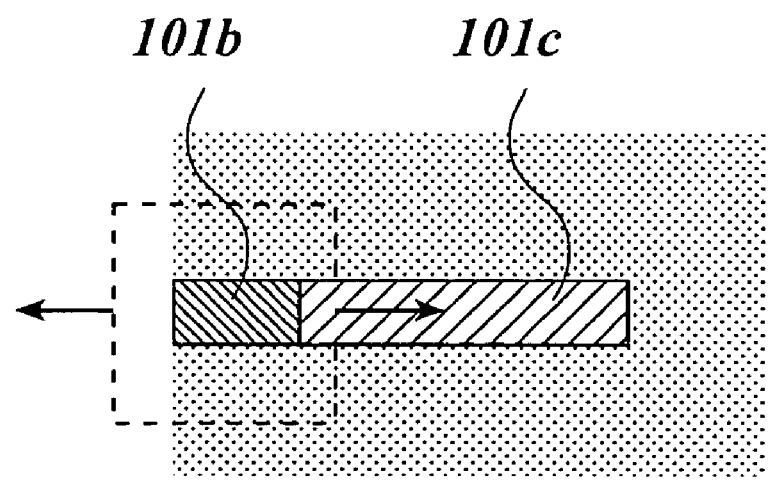
FIG. 10B is a plan view of the liquid drop pattern.
Figure 11A:
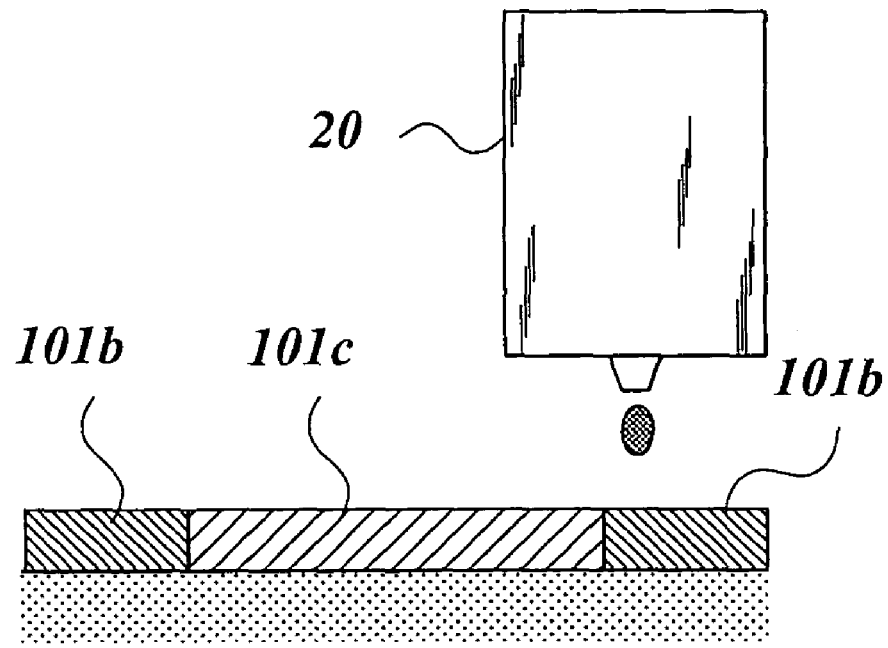
FIG. 11A is a vertical sectional view of the solution jetting device and the base member.
Figure 11B:
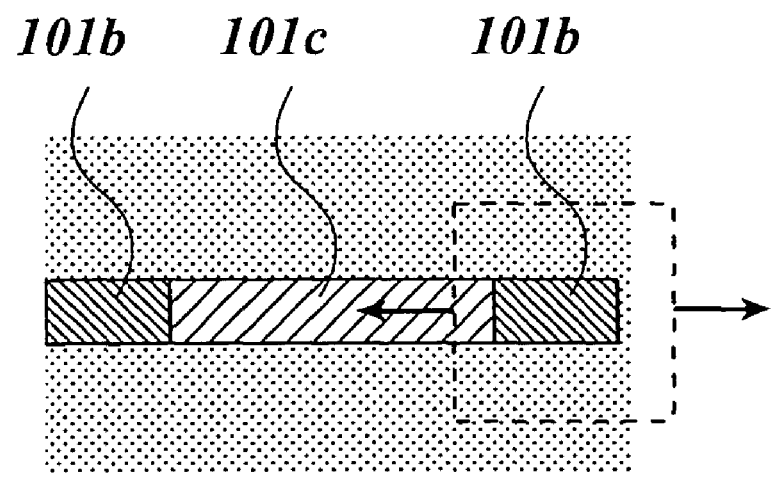
FIG. 11B is a plan view of the liquid drop pattern.

Hereinafter, the procedure is described with reference to FIGS. 9A to 11B. FIGS. 9A, 10A and 11A show vertical sectional views taken along a center line of a resistor to be formed, and FIGS. 9B, 10B and 11B show plan views.

The resistive film 101C is initially formed on the surface of the base member K.

Figure 9B:
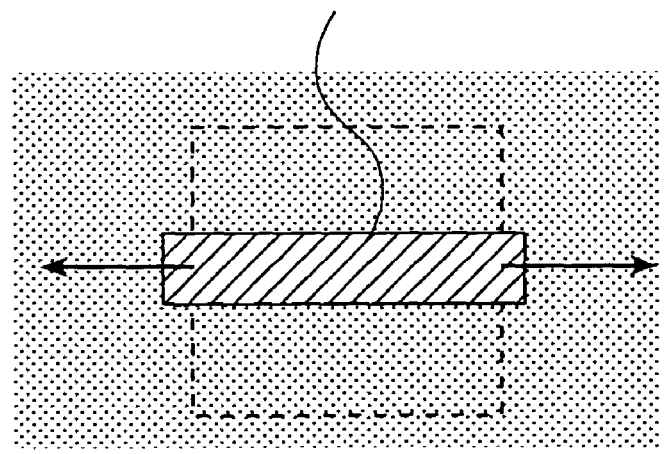
FIG. 9B is a plan view of the liquid drop pattern.

In detail, the solution jetting device 20 is moved to and scanned in the area of the resistive film 101C to be formed, and liquid drops of the resistive solution are jetted as shown in FIGS. 9A and 9B to form a liquid drop pattern (hereinafter, named a resistive liquid drop pattern) 101c on the surface of the base member K. Because the resistance of a resistor is proportional to the length of the resistor and is inversely proportional to the sectional area of the resistor, the width, height and length of the resistive liquid drop pattern 101c are set according to an aimed resistance of the resistor.

Thereafter, the resistive film 101C is formed on the surface of the base member K by performing the drying processing and the melting-sticking processing in the inside of the chamber of the melting-sticking device 30.

Thereafter, as shown in FIGS. 10A and 11A, the solution jetting device 20 is moved to and scanned in the areas of the conductive films 101B to be formed, and the conductive films 101B are formed so as to place the resistive film 101C between the conductive films 101B.

In detail, the nozzle 21 is moved as shown by arrows of FIGS. 10B and 11B by scanning the solution jetting device 20 while jetting the liquid drops. Therefore, two liquid drop patterns (hereinafter, named conductive liquid drop patterns) 101b and 101b are formed on the surface of the base member K so as to form linearly continuing conductive liquid drop patterns 101b and 101b through the resistive film 101C which is placed therebetween. Various shapes of the liquid drop pattern 101b other than the shape shown in FIGS. 9A to 11B can be allowed.

Thereafter, the conductive films 101B are formed on the surface of the base member K by using the melting-sticking device 30 in the same manner as the formation of the conductive films 101B in the third example.

When it is desired to minutely adjust the resistance of the resistor, the resistive solution is jetted to the resistive film 101C to thicken or widen the resistive film 101C. Therefore, the resistance of the resistor can be decreased to a correct value.

In the manufacturing device 100 described above, the inner diameter of the discharge port of the nozzle 21 ranges from 0.1 μm to 100 μm, and the nozzle 21 has a low conductance. Therefore, when the voltage of an arbitrary wave form is applied to the solution which is supplied to the nozzle 21, an amount of the jetted solution per unit time can be reduced. That is, the liquid drop can fine down. Therefore, a liquid drop pattern composed of a plurality of finer liquid drops than those in the earlier development can be formed on the surface of the base member K. The volume of each liquid drop is, for example, smaller than 1 pico-liter or 100 femto-liter. Because the electrified solution is jetted, the vapor pressure of the liquid drop can be reduced, and the vaporization of the liquid drop can be suppressed. Further, because the vaporization of the liquid drop is suppressed, the loss of the liquid drop in weight can be reduced, the flying of the liquid drop is stabilized, and the positional accuracy of the arriving liquid drop can be improved. Therefore, a liquid drop pattern composed of a plurality of fine liquid drops can be reliably formed on the surface of the base member K.

The dispersant of the liquid drop is broken down and vaporized by giving heat or light to the fine liquid drop arriving at the surface of the base member K, and the fine particles in the liquid drop contact with one another, melt and stick to one another. Therefore, an electronic circuit set to a line width smaller than 10 μm can be formed on the surface of the base member K. In other words, a circuit substrate having an electronic circuit set to a line width smaller than tens μm can be formed on the surface of the base member K.

Further, because the average diameter of the fine particle is smaller than or equal to 100 nm, the fine particle can be easily jetted from the discharge port set to the inner diameter ranging from 0.1 μm to 100 μm. An electronic circuit having a fine line width can be formed by making the fine particles melt and stick to one another.

Further, the fine particles made of the conductive material are used, and the fine particles melt and stick to one another. Therefore, the conductive film 101C, the wire and/or the electrode film can be formed on the surface of the base member K.

Further, the fine particles made of the semi-conductive material are used, and the fine particles melt and stick to one another. Therefore, the resistive film 101C can be formed on the surface of the base member K. Therefore, when wires are, for example, formed on both ends of the resistive film 101C, a resistor can be formed on the surface of the base member K.

Further, the fine particles made of the insulating material or the dielectric material are used, and the fine particles melt and stick to one another. Therefore, the insulating film 101A can be formed on the surface of the base member K. Therefore, when electrode films are, for example, formed so as to place the insulating film 101A between the electrode films, a condenser can be formed on the surface of the base member K.

Further, the adhesion solution is jetted on the surface of the base member K, and the fine particles are scattered on the formed fine adhesion liquid drop pattern to make the fine particles adhere to the adhesion particles. Thereafter, fine particles not adhere to the adhesion particles among the scattered fine particles are blown off from the surface of the base member K. Therefore, a fine particle pattern having the same shape as the adhesion liquid drop pattern can be formed on the fine adhesion liquid drop pattern which is formed on the surface of the base member K.

Further, when the dry processing and the melting-sticking processing are performed, an electronic circuit set to a line width smaller than 10 μm can be formed on the surface of the base member K. In other words, a circuit substrate having an electronic circuit set to a line width smaller than tens μm can be formed on the surface of the base member K.

In this embodiment, the condenser or the resistor is formed by using the manufacturing device 100. However, an organic transistor, an inorganic transistor or another electronic element may be formed.

(Method of Lowering Applied Voltage and Stably Jetting Small Amount of Liquid Drop)

In this invention, the role of the nozzle in an electrostatic suction type ink jet method is again considered. That is, the Maxwell force is used for a jetting impossible zone (expressions (4), (5) and (6)) not researched in the earlier development, and the fine liquid drop can form.

$$d < \frac{\lambda_0}{2} \quad (4)$$

$$d < \frac{\pi \gamma h^2}{\varepsilon_0 V^2} \quad (5)$$

-continued $$V < h \sqrt{\frac{\pi \gamma}{\varepsilon_0 d}} \quad (6)$$

Formulas approximately expressing jetting conditions for a method of lowering the applied voltage and stably jetting a small amount of liquid drop will be described.

Following expression can be applied to the liquid jetting device described in the embodiment of the present invention.

Figure 12:
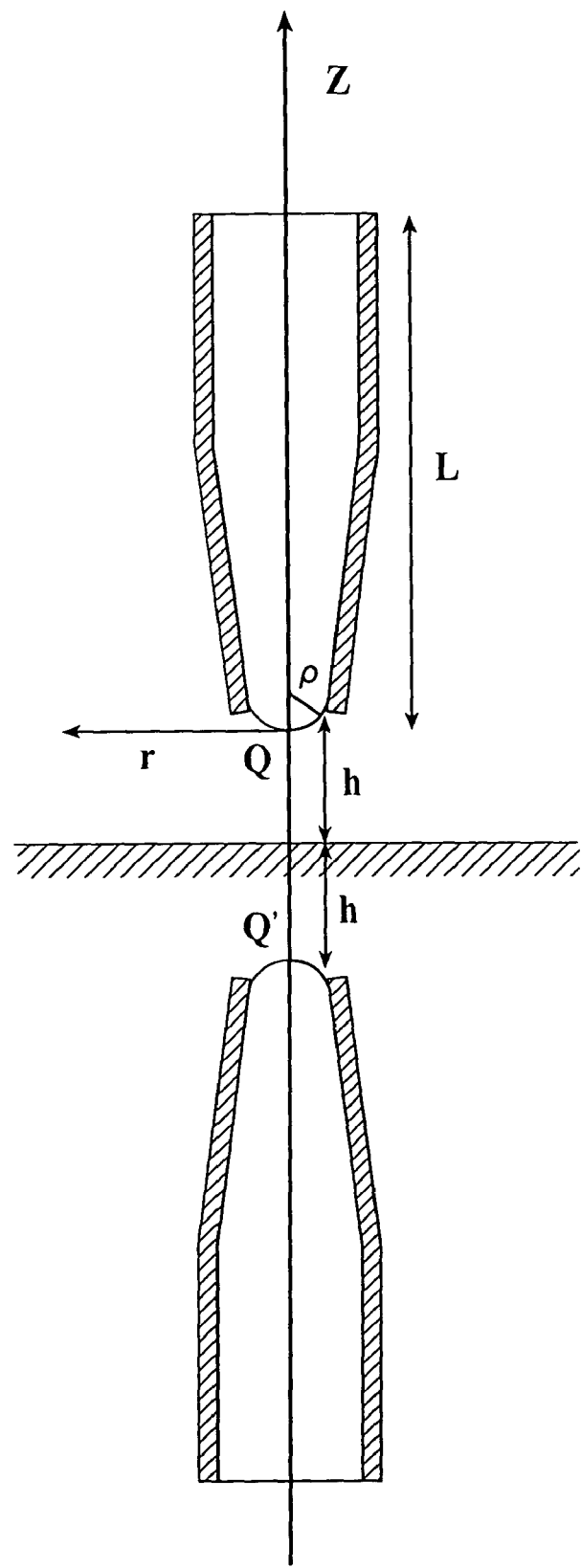
FIG. 12 is a view explaining the calculation of an electric field strength in the nozzle according to the embodiment of the present invention.

It is assumed that the conductive solution is injected into a nozzle of a radius r and the nozzle is placed vertically at a height of h from a conductive plate infinitely extending and acting as the substrate. This condition is shown in FIG. 12. In this case, it is assumed that the charge at the top of the nozzle is concentrated on a hemispherical portion of the top of the nozzle, and the charge Q is approximately expressed in the seventh formula.

$$Q = 2\pi\varepsilon_0 \alpha V d \quad (7)$$

Here, Q denotes a charge value (C) at the top of the nozzle, $\varepsilon_0$ denotes a dielectric constant (F/m) in vacuum, $\varepsilon$ denotes a dielectric constant (F/m) of the base member, h denotes the length (m) between the nozzle and the base member, d denotes the inner diameter (m) of the nozzle, V denotes the jet (total) voltage (V) applied to the nozzle, and α denotes a proportional constant depending on the nozzle shape, ranges around 1 to 1.5, and is around 1 in case of d<<h.

When a conductive substrate is used as the substrate, a mirror image charge Q' having a polarity inverse to and the same absolute value as those of the charge Q is induced at a position symmetric to that of the nozzle with respect to the substrate. When an insulating substrate is used as the substrate, a projected image charge Q' having a polarity inverse to and the same absolute value as those of the charge Q is induced at a symmetric position which depends on the dielectric constant.

A concentrated electric field strength $E_{loc}$ (V/m) at the top of the nozzle is expressed in the eighth formula.

$$E_{loc} = \frac{V}{KR} \quad (8)$$

Here, R denotes a curvature radius (m) at the top of the nozzle, and k denotes a proportional constant depending on the nozzle shape, ranges from 1.5 to 8.5 and is around 5 in many cases (refer to P. J. Birdseye and D. A. Smith, Surface Science, 23 (1970) 198–210).

To simplify the description, d/2=R is set. This expression denotes that the conductive solution is swelled at the top of the nozzle in hemispherical shape having the same radius as the nozzle radius due to the surface tension.

The balance of force given to the liquid at the top of the nozzle is considered. Initially, the electrostatic force $P_e$ is expressed in the ninth formula.

$$P_e = \frac{Q}{S} E_{loc} \approx \frac{Q}{\pi d^2/2} E_{loc} \quad (9)$$

Here, S denotes a surface area (m²) of the liquid at the top of the nozzle. The formula (9) is rewritten by using the formulas (7) and (8) while setting α=1.

$$P_e = \frac{2\varepsilon_0 V}{d/2} \cdot \frac{V}{kd/2} = \frac{8\varepsilon_0 V^2}{kd^2} \quad (10)$$

The surface tension $P_s$ of the liquid at the top of the nozzle is expressed in the eleventh formula.

$$P_s = \frac{4\gamma}{d} \quad (11)$$

Here, γ denotes the surface tension (N/m) of the liquid.

The condition for jetting the liquid by the electrostatic force is that the electrostatic force is stronger than the surface tension. Therefore, the twelfth formula is obtained.

$$P_e > P_s \quad (12)$$

When the nozzle having a sufficiently small diameter d is used, the electrostatic force can be stronger than the surface tension.

The relationship between V and d is obtained from the relationship of the formula (12).

$$V > \sqrt{\frac{\gamma k d}{2\varepsilon_0}} \quad (13)$$

The formula (13) gives a minimum voltage for the jet.
The range of the operational voltage in this embodiment is obtained from the formulas (6) and (13).

$$h\sqrt{\frac{\gamma\pi}{\varepsilon_0 d}} > V > \sqrt{\frac{\gamma k d}{2\varepsilon_0}} \quad (14)$$

Figure 13:
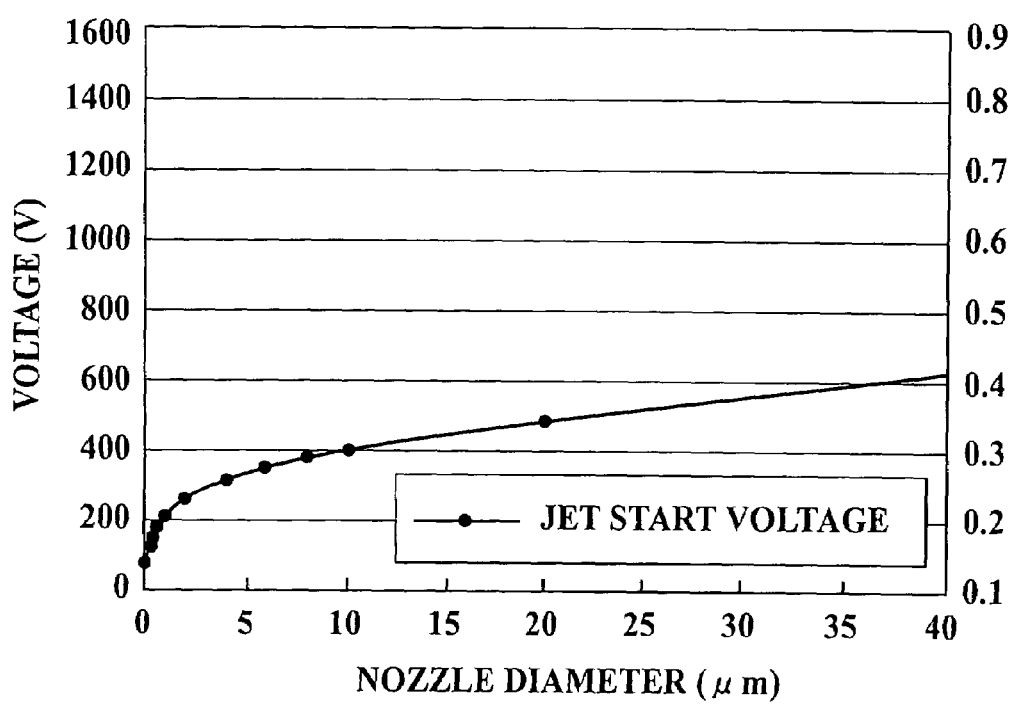
FIG. 13 is a graphical view showing a jet starting voltage, at which a liquid drop is jetted from the meniscus area and starts to fly, with respect to a nozzle diameter.

The dependency of a jet limit voltage (or a jet starting voltage) Vc on the nozzle having a radius r is shown in FIG. 13. In FIG. 13, when the effect of the concentration of the electric field due to the fine nozzle is considered, it is ascertained that the jet starting voltage is lowered with the decrease of the nozzle diameter.

In the way of thinking an electric field in the earlier development, that is, when only the voltage applied to the nozzle and the electric field determined by the distance between the counter electrodes are considered, the smaller the diameter of the nozzle is, the larger the voltage required for the jet is. In contrast, when local electric field strength attracts attention, the jet voltage can be lowered by using a fine nozzle.

The jet in the electrostatic suction is based on the electrification of the liquid at the top of the nozzle. The electrifying speed τ is substantially a time constant determined by the dielectric relaxation.

$$\tau = \frac{\varepsilon}{\sigma} \quad (15)$$

Here, ε denotes a relative dielectric constant (F/m) of the liquid, and σ denotes a conductivity (S/m) of the liquid. When the relative dielectric constant of the liquid equal to 10 and the conductivity of the liquid equal to $10^{-6}$ S/m are adopted as an example, τ=1.854×$10^{-5}$ second is obtained. When a critical frequency $f_c$ (Hz) is used, the sixteenth formula is obtained.

$$f_c = \frac{\sigma}{\varepsilon} \quad (16)$$

When the electric field is changed at a frequency higher than the critical frequency $f_c$, the charge at the top of the nozzle cannot move at the frequency of the electric field, and the liquid cannot be jetted. In this example, the critical frequency is equal to around 10 kHz. In this case, when the nozzle radius of 2 μm and the applied voltage of 500V or less are adopted, a flow rate G of the liquid in the nozzle is estimated at $10^{-13}$ m³/s. However, because the liquid of this example can be jetted at the frequency of 10 kHz, a minimum amount of jetted liquid per a cycle reaches 10 femto-liter (1 femto-liter is equal to $10^{-15}$ liter).

As shown in FIG. 12, this embodiment is characterized by the effect of the concentration of the electric field at the top of the nozzle and the function of the mirror image force which is induced on the opposite substrate. Therefore, though the conductive substrate or the conductive support member of the substrate is used in the earlier development or the voltage is applied to the substrate or the support member of the substrate in the earlier development, the use of the substrate or the support member or the applied voltage is not required in this embodiment. That is, in this embodiment, an insulating glass material, a plastic substrate made of polyimide, a ceramics substrate or a semiconductor substrate can be used as the substrate.

Any of the positive voltage and the negative voltage can be applied to the electrode in this embodiment.

The solution can be easily jetted by maintaining the length between the nozzle and the base member to 500 μm or less. Preferably, the length between the nozzle and the base member is maintained to a constant value by performing the feed-back control for the detected position of the nozzle (not shown).

Preferably, the base element is mounted and held on a conductive or insulating base member holder.

Figure 14:
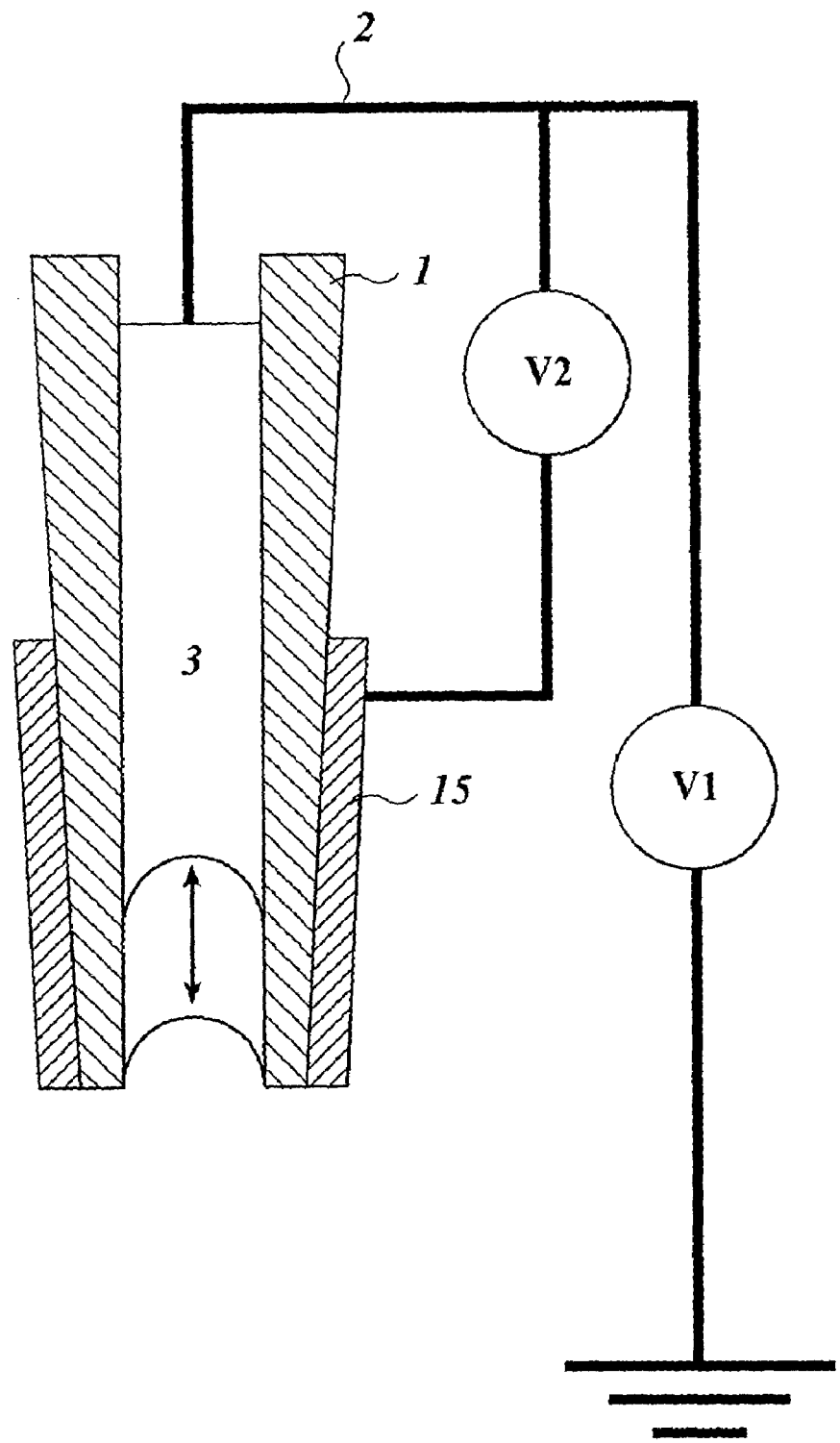
FIG. 14 is a vertical sectional view of the liquid jetting device and shows an electro-wetting state as an example of the embodiment of the present invention.

FIG. 14 is a vertical sectional view of the liquid jetting device as an example of the embodiment of the present invention.

An electrode 15 is arranged on the side surface of a nozzle 1, and a controlled voltage is applied to the electrode 15 surrounding the solution of the nozzle 13. The electrode 15 is used for the control of the electro-wetting effect. When a sufficient electric field is given to the insulator of the nozzle 1, it is expected that the electro-wetting effect is obtained without the electrode 15. However, the electrode 15 exerts the role of the control of the jet, in addition to the electro-wetting effect, by positively controlling the jet. The nozzle 1 is made of the insulator, and the thickness of 1 μm, the inner diameter of 2 μm and the applied voltage of 300V are set in the nozzle 1. In this case, the electro-wetting effect corresponding to around 30 atms is obtained. This pressure is not sufficient to jet the solution but is sufficient to supply the solution to the top of the nozzle 1. Therefore, the jet can be controlled by using the electrode 15.

In FIG. 13, the dependency of the jet starting voltage on the nozzle diameter is shown according to the present invention, and the liquid jetting device shown in FIG. 14 is used. The smaller the diameter of the nozzle is, the lower the jet starting voltage is. Therefore, the liquid drop can be jetted at a voltage lower than that in the earlier development.

In the embodiment, the conditions of the jet of the liquid are expressed according to the function of the length (L) between the nozzle and the base member, the function of the amplitude of the applied voltage (V) and the function of the frequency (f) of the applied voltage, and it is required that each of the length (L), the voltage (V) and the frequency (f) satisfies a certain condition to jet the liquid drop. When one condition is not satisfied, it is required to change parameters of the other conditions.

Figure 15:
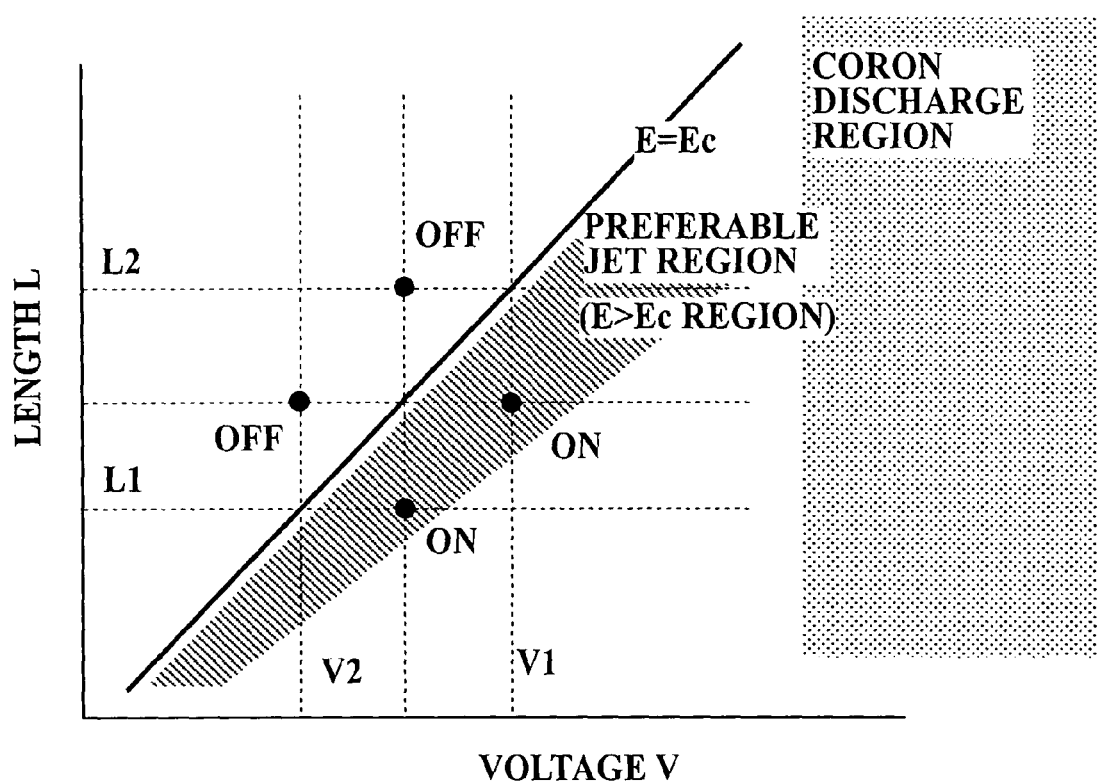
FIG. 15 is a view explaining a preferable jetting zone in the relationship of the length between the nozzle and the base member and an applied voltage in the liquid jetting device according to the embodiment of the present invention.

The conditions of the jet of the liquid will be described with reference to FIG. 15.

A critical electric field Ec is defined. Unless the electric field in the top of the nozzle is equal to or larger than the critical electric field, no liquid drop is jetted. The critical electric field depends on the nozzle diameter, the surface tension of the solution and the viscosity of the solution. It is difficult to jet the liquid drop when the electric field is equal to or lower than Ec. When the electric field at the top of the nozzle is equal to or larger than the critical electric field Ec, that is, in case of a jetting possible electric field strength, the length (L) is changed in proportional to the applied voltage (V). Therefore, when the length (L) is shortened, the critical applied voltage (V) can be reduced.

In contrast, when the length (L) between the nozzle and the base member is large, even though the electric field strength is maintained by enlarging the applied voltage (V), the liquid drop is exploded or burst due to the action of the corona jet. Therefore, to obtain a preferable jet characteristic, the length (L) between the nozzle and the base member is preferably set to be equal to or lower than 100 μm, and the positional accuracy of the arriving liquid drop can be heightened.

The entire disclosure of Japanese Patent Application No. Tokugan 2002-278223 filed on Sep. 24, 2002 including specification, claims, drawings and summary are incorporated herein by reference in its entirety.

What is claimed is:

1. A manufacturing method of a circuit substrate, in which an electronic circuit is formed on a surface of a base member by a solution jetting device, the manufacturing method comprising:
   providing a nozzle for the solution jetting device having a discharge port with an inner diameter of 0.1 μm to 100 μm;
   supplying a solution into the nozzle of the solution jetting device, wherein the solution includes a plurality of fine particles adapted to form an electronic circuit by melting and sticking to one another, and a dispersant for dispersing the fine particles;
   jetting liquid drops of the solution from the discharge port of the nozzle toward the surface of the base member by applying a voltage of an arbitrary waveform to the solution so that the solution is electrically charged; and
   exposing the jetted liquid drops received on the surface of the base member to light or heat to make the fine particles melt and stick to one another.

2. The manufacturing method of claim 1, wherein an average diameter of the fine particles is lower than or equal to 100 nm.

3. The manufacturing method of claim 1, wherein the fine particles are made of a conductive material.

4. The manufacturing method of claim 1, wherein the fine particles are made of a semi-conductive material.

5. The manufacturing method of claim 1, wherein the fine particles are made of an insulating material or a dielectric material.

6. The manufacturing method of claim 1, wherein an inner diameter of the discharge port is smaller than or equal to 30 μm.

7. The manufacturing method of claim 1, wherein an inner diameter of the discharge port is smaller than 20 μm.

8. The manufacturing method of claim 1, wherein an inner diameter of the discharge port is smaller than or equal to 8 μm.

9. The manufacturing method of claim 1, wherein an inner diameter of the discharge port is smaller than or equal to 4 μm.

10. A manufacturing method of a circuit substrate, in which an electronic circuit is formed on a surface of a base member by a solution jetting device, the manufacturing method comprising:
   providing a nozzle for the solution jetting device having a discharge port with an inner diameter of 0.1 μm to 100 μm and;
   supplying a solution into the nozzle of the solution letting device, wherein the solution includes a plurality of adhesion particles adapted for adhering fine particles to form an electronic circuit by melting and sticking the fine particles to one another, and a dispersant for dispersing the adhesion particles;
   jetting liquid drops of the solution from the discharge port of the nozzle toward the surface of the base member by applying a voltage of an arbitrary waveform to the solution so that the solution is electrically charged;
   scattering the fine particles on the jetted liquid drops received on the surface of the base member to adhere the fine particles to the adhesion particles;
   removing fine particles which are not adhering to the adhesion particles among the scattered fine particles, from the surface of the base member; and
   exposing the surface of the base member to light or heat to make the fine particles melt and stick to one another.

* * * * *